United States Patent
Frans et al.

(10) Patent No.: US 7,102,390 B2
(45) Date of Patent: *Sep. 5, 2006

(54) METHOD AND APPARATUS FOR SIGNAL RECEPTION USING GROUND TERMINATION AND/OR NON-GROUND TERMINATION

(75) Inventors: Yohan U. Frans, Palo Alto, CA (US); Nhat M. Nguyen, San Jose, CA (US); Yueyong Wang, Sunnyvale, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/058,088

(22) Filed: Feb. 15, 2005

(65) Prior Publication Data

US 2005/0189961 A1    Sep. 1, 2005

Related U.S. Application Data

(63) Continuation of application No. 10/435,292, filed on May 9, 2003, now Pat. No. 6,856,169.

(51) Int. Cl.
H03K 19/0175 (2006.01)
(52) U.S. Cl. .......................... 326/82; 326/26; 326/326; 326/30
(58) Field of Classification Search ............ 326/82–89, 326/115, 9, 30, 63
See application file for complete search history.

(56) References Cited

U.S. PATENT DOCUMENTS 4,513,427 A    4/1985    Borriello et al.

(Continued)

FOREIGN PATENT DOCUMENTS

EP    0482336    4/1992

OTHER PUBLICATIONS

Diermeier, A. "Interfacing between LVDS and ECL", Microprocessors and Microsystems, IPC Business Press LTD, London GB, vol. 21, No. 5, Feb. 1998, pp. 337-342.

GIGA, "10 Gbit/s Receiver, CDR and DeMUX GD16584/GD 16588 (FEC)", Data Sheet Rev. 12, Downloaded Jun. 14, 2005 from URL http://www.intel.com/design/network/datashts/giga/gd 16584.pdf, pp. 1-15.

(Continued)

Primary Examiner—Don Le
(74) Attorney, Agent, or Firm—Shemwell Mahamedi LLP

(57) ABSTRACT

Receiving units with inputs that may be ground-terminated and with inputs that are selectively ground-terminated or non-ground terminated are enabled with signal level shifting and a termination mode selection input. In a first exemplary implementation, a receiving unit is capable of having ground-terminated inputs. However, common mode voltage of the signal that is input to decoding data recovery circuitry is above ground because the input signal may be level shifted in between the ground-terminated inputs and the decoding data recovery circuitry. In a second exemplary implementation, a mode selection is accomplished by switching a voltage divider into operation and bypassing a level shifter for a non-ground terminated mode. For a ground terminated mode, the voltage divider is switched out of operation and the level shifter is switched into operation for its signal output to be decoded. Pre-amplification may also be employed to improve signal strength.

23 Claims, 14 Drawing Sheets

U.S. PATENT DOCUMENTS

| | | |
|---|---|---|
| 5,781,028 A | 7/1998 | Decuir et al. |
| 5,864,587 A | 1/1999 | Hunt et al. |
| 6,266,001 B1 | 7/2001 | Fang et al. |
| 6,344,765 B1 | 2/2002 | Taguchi |
| 6,356,114 B1 | 3/2002 | Selander |
| 6,445,331 B1 | 9/2002 | Stegers |
| 6,768,352 B1 | 7/2004 | Maher et al. |
| 2002/0175716 A1 | 11/2002 | Cyrusian |
| 2003/0087671 A1 | 5/2003 | Ruha et al. |

OTHER PUBLICATIONS

Patent Cooperation Treaty, International Search Report and Opinion of International Search Authority in re Application No. PCT/US2004/014150, Jun. 28, 2005, 21 pages.

METHOD AND APPARATUS FOR SIGNAL RECEPTION USING GROUND TERMINATION AND/OR NON-GROUND TERMINATION

CROSS-REFERENCE(S) TO RELATED APPLICATION(S)

This U.S. patent application is a continuation application of prior application Ser. No. 10/435,292, filed May 9, 2003, now issued as U.S. Pat. No. 6,856,169, which is hereby incorporated by reference in its entirety herein.

TECHNICAL FIELD

This disclosure relates in general to the field of signal reception in a ground termination mode and/or in a non-ground termination mode, and in particular, by way of example but not limitation, to implementing (i) a signal receiving unit having ground-terminated inputs and accommodation for data recovery circuitry that is designed to prefer positive common mode voltages and/or (ii) a multi-mode signal receiving unit that is adapted to selectively provide ground-terminated inputs and non-ground-terminated inputs for routing to data recovery circuitry.

BACKGROUND

Electronic signaling within and between integrated circuits (ICs) is accomplished using many different formats, standards, and approaches. Each of these electronic signaling types may be based on and/or reflect a voltage range or swings thereof, an absolute current or changes thereto, a signaling speed or frequency modulation, a combination thereof, and so forth. The various circuits that are used to implement such different electronic signaling types are equally diverse.

Two examples of such diverse circuit types for implementing the different electronic signaling types are (i) Positive-Referenced Emitter Coupled Logic (PECL) circuitry and (ii) Peripheral Control Interface (PCI) Express circuitry. These two circuit types may be employed as, for example, signal input receivers.

FIG. 1 illustrates a conventional signal input receiver that may be PECL-compliant. In a described implementation, FIG. 1 is divided into two general regions: an off chip region and an on chip region, with the on chip region representing an IC chip. The demarcation between these two regions is indicated by dashed lines. The on chip region includes a sampler 101 that is adapted to recover data from signals that are received from the off chip region.

The off chip region includes two inputs INP and INN. These inputs may represent a positive input (INP) and a negative input (INN) for a two-line signaling format such as differential signaling. The off chip region is alternating current (AC) coupled to the on chip region via an AC coupling capacitance as represented by capacitors 103P and 103N.

Via capacitors 103P and 103N, incoming signals are provided to the chip at a positive receiver termination (RTP) node and a negative receiver termination (RTN) node. Depending on the context herein, node labels such as "RTP" and "RTN" may represent a physical node of a circuit, a voltage level at the node, signals present at and/or propagating through the node, an input and/or output, some combination thereof, and so forth.

A resistor 105 is coupled between nodes RTP and RTN. The resistance value of resistor 105 is equal to two times the termination resistance (designated "$R_{TERM}$") that is used to terminate a link that is represented by the lines for nodes INP and INN. The individual termination resistances are set equal to the impedance of the link to reduce, if not minimize, signal reflections that arise from mismatched impedances. For example, the resistance value of resistor 105 may be set to match twice an individual trace impedance of a printed circuit board (PCB) to which the IC chip is coupled.

A resistor 107P1 is connected in series with a resistor 107P2. Specifically, resistor 107P1 is coupled between a supply voltage $V_{DD}$ and node RTP, and resistor 107P2 is coupled between node RTP and a ground potential. Resistors 107P1 and 107P2 therefore form a voltage divider 107P that can set a DC voltage level for node RTP in conjunction with supply voltage $V_{DD}$. In other words, for voltage divider 107P, the ratio of the resistance value of resistor 107P1 to the sum of the resistance values of resistors 107P1 and 107P2 sets the DC voltage level at node RTP as a percentage of supply voltage $V_{DD}$.

Similarly, resistor 107N1 is connected in series with a resistor 107N2. Specifically, resistor 107N1 is coupled between supply voltage $V_{DD}$ and node RTN, and resistor 107N2 is coupled between node RTN and the ground potential. Resistors 107N1 and 107N2 therefore form a voltage divider 107N that can set a DC voltage level for node RTN in conjunction with supply voltage $V_{DD}$.

Nodes RTP and RTN are input to sampler 101 so that the sampler circuitry 19 thereof may recover the data encoded into the differential signals that are present at nodes RTP and RTN. A common mode voltage for the RTP and RTN inputs into sampler 101 may be established using the voltage dividers 107P and 107N that are created by resistors 107P1, 107P2 and 107N1, 107N2, respectively.

With off-chip AC coupling via capacitors 103P and 103N, the common mode voltage of nodes RTP and RTN can be set to a desired voltage level regardless of the incoming common mode voltage of nodes INP and INN by using voltage dividers 107P and 107N. The common mode voltage of nodes RTP and RTN is typically set to a voltage level that optimizes the input sensitivity of sampler 101 and that allows a desired voltage swing at nodes RTP and RTN without turning on an electrostatic discharge (ESD)-protection diode, especially in a low supply voltage $V_{DD}$ environment.

As noted above, the conventional signal input receiver of FIG. 1 may be PECL-compliant. For example, such a signal input receiver may be used in a device that comports with a given PECL standard. However, it should be understood that other circuitry may also be involved to fully realize a complete device that comports with the given PECL standard.

For PECL signaling on a high-speed serial link for example, a high voltage swing is typically employed. Also, sampler 101 is typically designed with transistors that do not perform well at input common mode voltages near, much less below, zero volts. Consequently, the common mode voltage set by voltage dividers 107P and 107N is typically far above zero volts. However, for PCI Express signaling, the signal input receiver is specified to have a zero volt termination.

In other words for PCI Express signaling, the signal common mode voltage on the chip side of the AC coupling capacitors 103P and 103N (i.e., the common mode voltage at nodes RTP and RTN) is to be maintained at zero volts. The signal input receiver of FIG. 1 therefore fails to meet the specifications for PCI Express. Moreover as noted above, even if nodes RTP and RTN were forced to zero volts, samplers 101 tend not to operate in an optimum fashion with common mode voltages that are not at a sufficiently positive level.

Regardless, the conventional signal input receiver of FIG. 1 as illustrated has inputs to the IC chip that have a common mode voltage that is equal to that of the inputs to sampler 101. However, the common mode voltage of the inputs to the IC chip may be separated from the common mode voltage of the inputs to sampler 101, as illustrated in FIG. 2.

FIG. 2 illustrates a conventional signal input receiver that may be PCI Express-compliant and/or PECL compliant. The circuitry of FIG. 2 is similar to the circuitry of FIG. 1. However, the conventional signal input receiver of FIG. 2 is illustrated with inputs to the IC chip that have a common mode voltage that is not equal to that of the inputs of sampler 101.

One notable component-level difference is the addition of on-chip capacitance as implemented by capacitors 203P and 203N. Capacitor 203P and capacitor 203N are coupled between nodes RTP and RDP and nodes RTN and RDN, respectively. The impact of capacitors 203P and 203N, as well as the presence of nodes RDP and RDN, is described further below.

As in FIG. 1, the input signals INP and INN that are arriving at the on chip region from the off chip region are provided via the AC coupling capacitance as represented by capacitors 103P and 103N, respectively. The input signals on line INP and line INN are terminated at node RTP and node RTN using a resistor 201P and a resistor 201N, respectively. Each resistance value for resistors 201P and 201N is set equal to "$R_{TERM}$", a resistance value that equals the impedance of a respective input line INP and INN.

Sampler 101 of FIG. 2 also recovers data that is encoded into signaling such as the differential signaling that is initially received at nodes RTP and RTN. Resistors 107P1 and 107P2 and resistors 107N1 and 107N2 function to divide supply voltage $V_{DD}$ into two parts as separated by the input nodes RDP and RDN, respectively, of sampler 101.

However, these input nodes RDP and RDN of sampler 101 no longer correspond to the on chip input nodes RTP and RTN from a DC perspective because of capacitors 203P and 203N. Instead, node "RDP" corresponds to a positive receiver node that is decoupled from node RTP from a DC perspective because of the effects of capacitor 203P. Node "RDN" corresponds to a negative receiver node that is decoupled from node RTN from a DC perspective because of the effects of capacitor 203N.

Thus, capacitors 203P and 203N impact the on chip circuitry of FIG. 2 by creating an AC-coupling between nodes RTP and RDP and between nodes RTN and RDN. This AC coupling enables the on chip circuitry to provide ground-terminated inputs to the off-chip signaling in order to meet the specifications of PCI Express. Moreover, the AC decoupling created by capacitors 203P and 203N permits use of voltage dividers 107P and 107N in order to set a common mode voltage for the inputs of sampler 101 that is above ground. This improves the sensitivity of sampler 101.

Unfortunately, there are drawbacks to using the on-chip capacitance as implemented with capacitors 203P and 203N. In order to ensure that a long string of "1s" or "0s" is not degraded, the value of the on-chip capacitors is relatively large. For example, if the resistance value of resistor 107P1 in parallel with resistor 107P2 (and resistor 107N1 in parallel with resistor 107N2) is typically equal to a few kilo-ohms, then the capacitance value of capacitor 203P (and capacitor 203N) is equal to a few hundred pico-farads. The consequences to this drawback are described further below with regard to two possible approaches for creating capacitors 203P and 203N.

These two possible approaches are (i) using a transistor that is operating as a capacitor and (ii) using a metal capacitor built directly on the IC chip. In the first approach, capacitors 203P and 203N are created using an active device such as a metal oxide semiconductor (MOS) transistor. Unfortunately, not only does each such transistor occupy a large surface area of the IC chip, but this approach places another constraint on sampler 101. Specifically, the common mode voltage of nodes RDP and RDN is limited to ensure that the transistor is fully turned on.

In the second approach, capacitors 203P and 203N are created using two 11 metal layers that are separated by some dielectric. In other words, capacitors 203P and 203N may be created using a "metal cap". Unfortunately, because the capacitance value of such capacitors is equal to a few hundred pico-farads, the dielectric is thick relative to a gate oxide thickness of the first (transistor) approach and the surface area of each such metal cap is quite large. This surface area is even larger than that required for active devices because metal caps have a lower capacitance per unit area. The large surface area that is consumed by either a metal cap or a transistor is undesirable because it adds to the size and thus the cost of an IC chip.

Moreover, with either approach, because nodes RDP and RDN are not accessible off chip, no DC test of sampler 101 may be performed. Furthermore, problems can develop with large swings of the INP and INN signals. For example, PECL-compliant signals have a maximum input voltage swing of 2.6 volts peak-to-peak. If the input signals RTP and RTN undergo a 2.6 volt peak-to-peak swing about a ground termination level, the input signal may plunge sufficiently below zero volts so as to turn on the ESD-protection diode.

Thus, there is no existing approach for combining a PCI Express-compliant signal input receiver and a PECL-compliant signal input receiver. Accordingly, there is a need for methods and apparatuses for implementing a multi-mode signal input receiver, including schemes and techniques that enable such a multi-mode signal input receiver to reproduce respective characteristics of the different signal input receivers for the respective individual modes.

Furthermore, there is no existing approach for efficiently integrating into a signal input receiver both (i) PCI Express-compliant inputs that are ground terminated and (ii) a typical sampler that is more sensitive with a positive common mode voltage input. Accordingly, there is a need for methods and apparatuses for implementing a signal input receiver in which PCI Express-compliant inputs are efficiently and operationally integrated with a typical sampler without sacrificing the input sensitivity thereof.

BRIEF DESCRIPTION OF THE DRAWINGS

In the Drawings, like numerals are used for like and/or corresponding features, aspects, and components of the various FIGS. 1–12.

DETAILED DESCRIPTION

Figure 1:
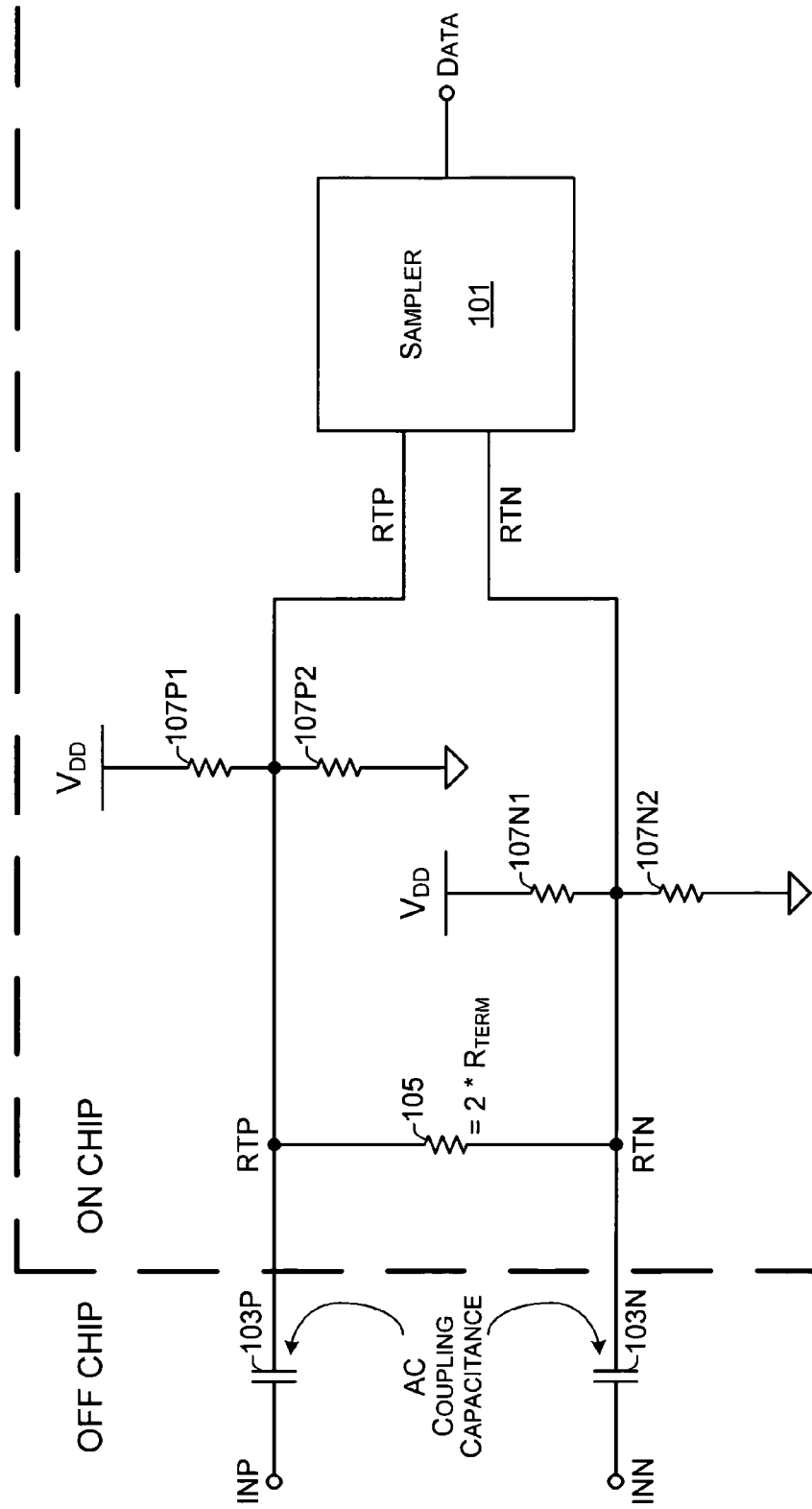
FIG. 1 illustrates a conventional signal input receiver that may be Positive-Referenced Emitter Coupled Logic (PECL)-compliant.
Figure 2:
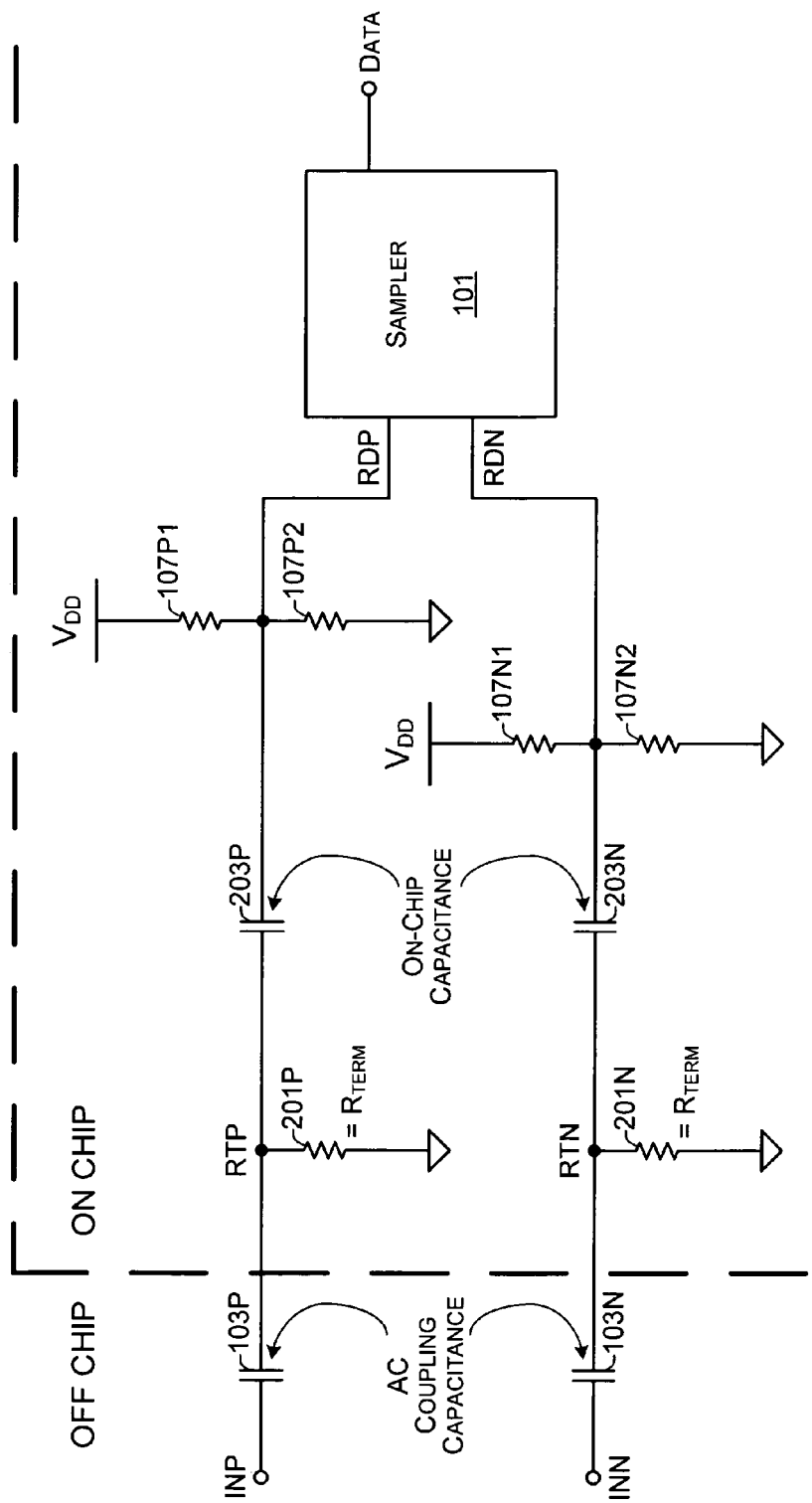
FIG. 2 illustrates a conventional signal input receiver that may be Peripheral Control Interface (PCI) Express-compliant.
Figure 3:
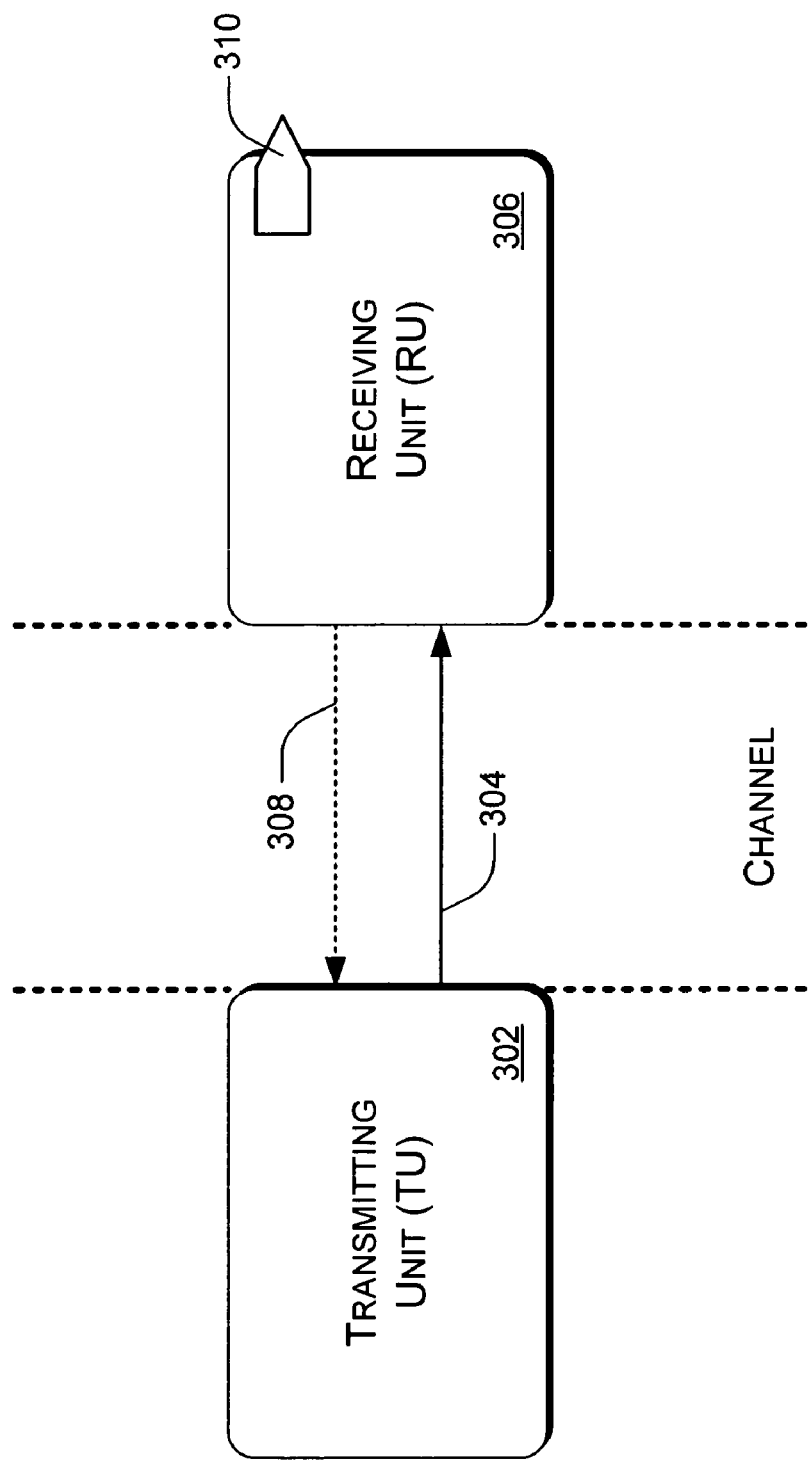
FIG. 3 is a block diagram that illustrates signaling across a channel between an exemplary transmitting unit (TU) and an exemplary receiving unit (RU).

FIG. 3 is a block diagram that illustrates signaling across a channel between exemplary electronic units. These electronic units include an exemplary transmitting unit (TU) 302 and an exemplary receiving unit (RU) 306. TU 302 sends a signal 304 to RU 306 across the illustrated channel. Although only a single signal 304 is shown being transmitted from TU 302 to RU 306, in many cases there may be multiple signals transmitted from TU 302 to RU 306 using signal output driver circuitry (at TU 302) and signal input receiver circuitry (at RU 306). Additionally, one or more signals may be transmitted from RU 306 to TU 302, as indicated by the dashed arrow representing optional signal(s) 308.

The TU 302 may comprise a transmitter, a circuit, a portion of a circuit, an IC chip, a PCB, an electronic subsystem, a computer, and so forth. Similarly, RU 306 may comprise a receiver, a circuit, a portion of a circuit, an IC chip, a PCB, an electronic subsystem, a computer, and so forth. By way of example, TU 302 and RU 306 may jointly or separately comprise a memory chip, a memory module, a memory system, and so forth. More specifically, TU 302 and RU 306 may comprise a memory controller, a memory storage device, any general memory component, and so forth. TU 302 and RU 306 may be on the same IC, may be on different ICs (e.g., on a single PCB or on different PCBs), may be on separate components (e.g., separate cards, modules, etc. that are connected by one or more buses, etc.), may be connected by one or more backplanes, and so forth.

Although signal(s) 304 and 308 can be any general signal that is capable of communicating information, the signals are digital or analog signals in the described implementation(s). If the signals are digital, for example, they may relate to memory read/write data, control data, address data, and so forth. However, such digital signals may more generally represent the binary data of any computing system. Furthermore, signals 304 and 308 may be single-ended signals, differential signals, some combination thereof, and so forth.

The RU 306 includes a mode select input 310. Mode select input 310 is used to select which of two or more modes RU 306 is to use for signal reception. In a described implementation, mode select input 310 selects between a ground termination (GT) signal input receiving mode and a non-ground termination signal input receiving mode. For example, mode select input 310 may select between a PCI Express signal input receiving mode and a PECL signal input receiving mode. However, mode select input 310 may be used to select between or among other signal input reception modes and to initiate any such signal input reception modes. Depending on the physical make-up of RU 306, mode select input 310 may be an input/output (I/O) pin of an IC, a line into a circuit or circuit portion, an input to or a lead across a PCB, some combination thereof, and so forth.

Figure 4:
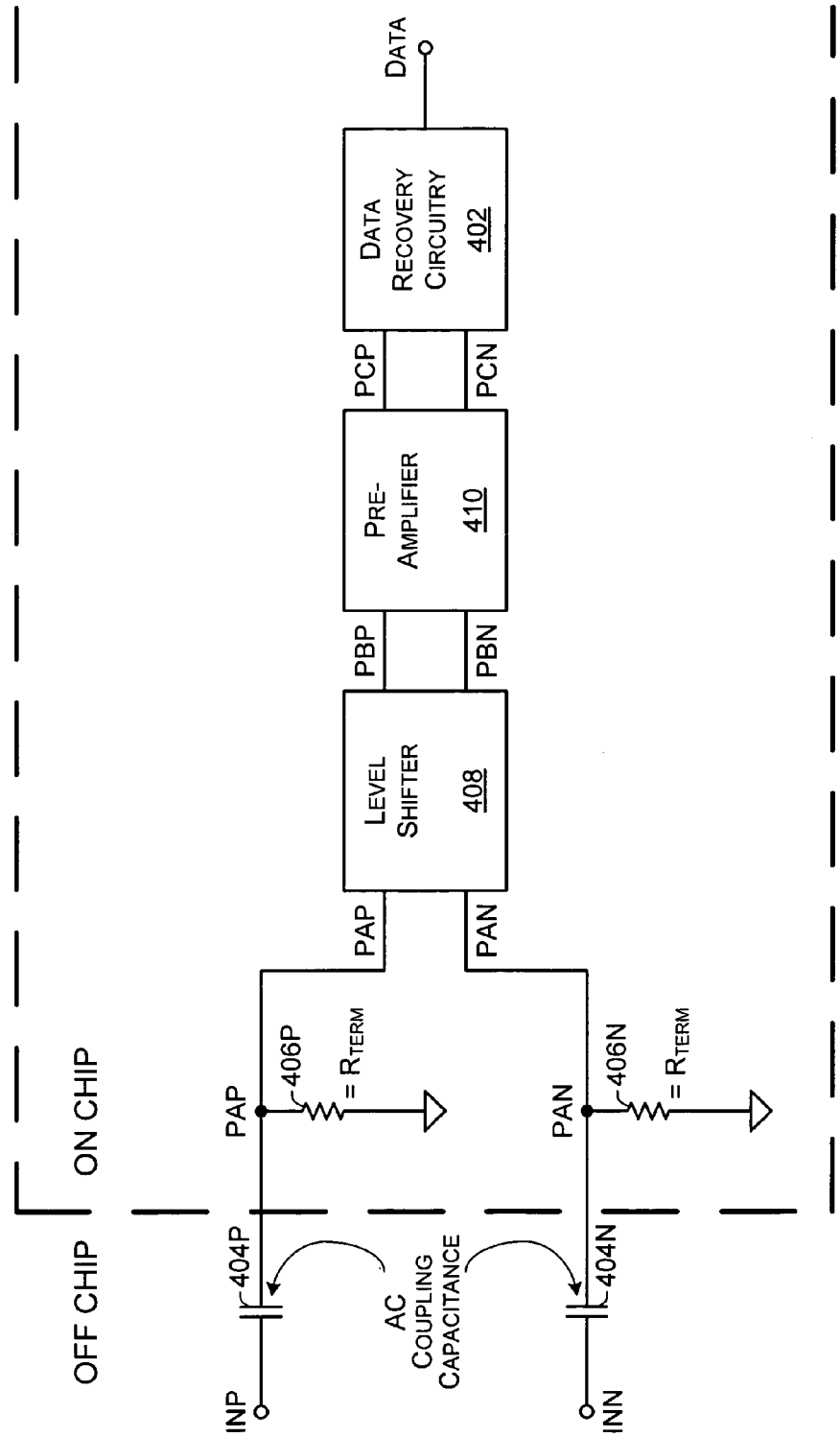
FIG. 4 illustrates an exemplary RU having ground-terminated inputs along with a level shifter, a pre-amplifier, and data recovery circuitry.

FIG. 4 illustrates an exemplary on-chip RU having ground-terminated inputs PAP and PAN along with a level shifter 408, a pre-amplifier 410, and data recovery circuitry 402. The illustrated on-chip RU is capable of receiving and interpreting/decoding signals from off chip.

Specifically, data recovery circuitry 402 is adapted to recover data that is encoded into signals received from off-chip input nodes INP and INN. Data recovery circuitry 402 may be implemented as one or more of a sampler, a slicer, and so forth. An exemplary data recovery circuitry 402 is described further below with reference to FIG. 11.

Off-chip input lines INP and INN are capable of propagating one or more signals. In an exemplary described implementation, these input signals comprise differential signals with input line INP carrying the "positive" portion and input line INN carrying the "negative" portion. These input lines INP and INN are AC coupled to the on-chip RU via capacitance that is represented by a capacitive element 404P and a capacitive element 404N, respectively. Although capacitive elements 404P and 404N are illustrated as capacitors, other components may alternatively be used to implement them.

The off-chip input lines INP and INN therefore provide signals to on-chip input nodes PAP and PAN via capacitive elements 404P and 404N. A resistive element 406P is coupled between node PAP and a common potential. Such a common potential may be any equalized voltage potential level. An example of a common potential is a ground potential. An example of a ground potential is zero (0) volts, but a different voltage level may alternatively be used as ground in any given circuit and/or system.

The resistance value of resistive element 406P (which is designated "$R_{TERM}$" for termination (resistive) element) is set approximately equal to an impedance value for incoming line INP. Matching the resistance value of resistive element 406P to the impedance value of input line INP reduces, if not minimizes, any signal reflections that ordinarily arise when impedances are mismatched.

Similarly, a resistive element 406N is coupled between node PAN and the ground potential. The resistance value of resistive element 406N (which is also designated "$R_{TERM}$") is set approximately equal to an impedance value for incoming line INN, which node PAN terminates. These incoming lines INP and INN may be connections on/to an IC chip, traces on a PCB, wires or other bus lines on a backplane, some combination thereof, and so forth.

Although resistive elements 406P and 406N are illustrated as resistors in FIG. 4 et seq., they may alternatively be implemented as any general resistive component. For example, a properly biased p-channel MOS (PMOS) transistor that is operating in the linear region may be used to implement a resistive element. Moreover, any general termination element, such as the exemplary resistive elements 406P and 406N, may alternatively be used to terminate the incoming lines INP and INN.

Nodes PAP and PAN are input into level shifter 408. Level shifter 408 is capable of shifting a level of a signal that is input thereto using active devices (e.g., transistors). In a described implementation, level shifter 408 is adapted to shift the voltage level of signals that are input from nodes PAP and PAN. Specifically, level shifter 408 shifts upwards (e.g., increases the value of) the common mode voltage of signals that are input thereto at nodes PAP and PAN. An exemplary level shifter 408 is described further below with reference to FIG. 6. The level-shifted signals are output from level shifter 408 at nodes PBP and PBN and provided to pre-amplifier 410.

Pre-amplifier 410 accepts the level-shifted signals that are output from level shifter 408 at nodes PBP and PBN. Pre-amplifier 410 is capable of amplifying signals that are input thereto to produce pre-amplified signals at nodes PCP and PCN. In a described implementation, pre-amplifier 410 is adapted to amplify the signals present at nodes PBP and PBN in order to account for signal attenuation that may be caused by the level shifting of level shifter 408. An exemplary pre-amplifier 410 is described further below also with reference to FIG. 6. The pre-amplified signals that are output from pre-amplifier 410 at nodes PCP and PCN are provided to data recovery circuitry 402.

In operation of a described implementation, differential signals arrive at the RU at on-chip nodes PAP and PAN from off-chip inputs INP and INN. These differential signals are ground terminated at nodes PAP and PAN without using on-chip capacitive element(s). A common mode voltage, which is at approximately zero volts in this described implementation, of the received differential signals is level-shifted by level shifter 408 to have a higher and a positive common mode voltage at outputs PBP and PBN.

The differential signals with the increased common mode voltage at nodes PBP and PBN are provided to pre-amplifier 410 in order to at least partially restore any signal strength that is lost during the level-shifting operation. The pre-amplified differential signals are output from pre-amplifier 410 at nodes PCP and PCN. A common mode voltage of the differential signals at nodes PCP and PCN is thus well above a zero-volt voltage level when the differential signals are supplied to data recovery circuitry 402. In fact, the common mode voltage of the differential signals at nodes PCP and PCN may be tailored to a range that corresponds to a maximum or superior sensitivity of data recovery circuitry 402.

Data recovery circuitry 402 interprets the differential signals at nodes PCP and PCN to recover the data encoded therein. This data is then output from data recovery circuitry 402. In this manner, the RU of FIG. 4 can be PCI Express-compliant (e.g., provide ground-terminated inputs) and have data recovery circuitry that is operating in its more sensitive range without resorting to a costly and inefficient on-chip capacitance approach.

Figure 5:
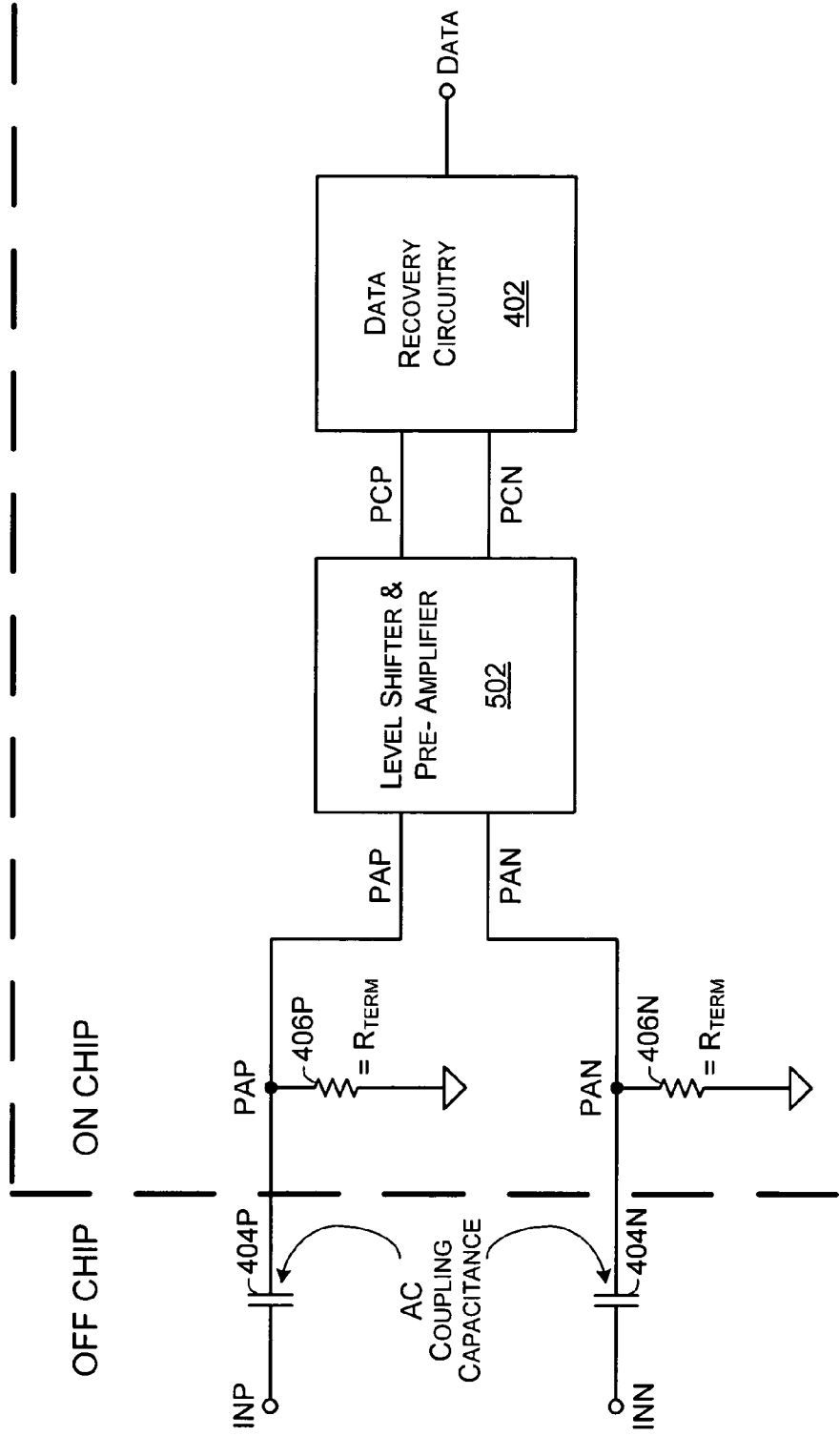
FIG. 5 illustrates an exemplary RU having ground-terminated inputs along with a level shifter and pre-amplifier and data recovery circuitry.

FIG. 5 illustrates an exemplary on-chip RU having ground-terminated inputs PAP and PAN along with a level shifter and pre-amplifier 502 and data recovery circuitry 402. FIG. 5 shows an alternative implementation to that of FIG. 4. Specifically, level shifter 408 and pre-amplifier 410 are replaced by a combination level shifter and pre-amplifier 502.

Level shifter and pre-amplifier 502 is connected in series between (i) termination resistive elements 406P and 406N at nodes PAP and PAN, respectively, and (ii) data recovery circuitry 402 at nodes PCP and PCN. Level shifter and pre-amplifier 502 both level-shifts and pre-amplifies incoming signals prior to forwarding them to the next stage. An exemplary level shifter and pre-amplifier 502 is described further below with reference to FIG. 7.

In operation of a described implementation, differential signals arrive at the RU at on-chip nodes PAP and PAN from off-chip inputs INP and INN. These differential signals are DC-ground terminated at nodes PAP and PAN without using on-chip capacitance. The at least approximately zero-volt common mode voltage, for this described implementation, of the received differential signals is level-shifted by level shifter and pre-amplifier 502 to have a greater and a positive common mode voltage. Additionally, level shifter and pre-amplifier 502 pre-amplifies the level-shifted differential signals to compensate for signal degeneration from the level-shifting operation.

The level-shifted and pre-amplified differential signals are output from level shifter and pre-amplifier 502 at nodes PCP and PCN. A common mode voltage of the differential signals at nodes PCP and PCN is thus well above a zero-volt voltage level when the differential signals are supplied to data recovery circuitry 402. In fact, the common mode voltage of the differential signals at nodes PCP and PCN may be tailored by level shifter and pre-amplifier 502 to a range that corresponds to a maximum or superior sensitivity of data recovery circuitry 402.

Data recovery circuitry 402 interprets the differential signals at nodes PCP and PCN to recover the data encoded therein. This data is then output from data recovery circuitry 402. In this manner, the RU of FIG. 5 can also be PCI Express-compliant while using data recovery circuitry that is operating in its more-sensitive range without resorting to a costly and inefficient on-chip capacitance approach.

Figure 6:
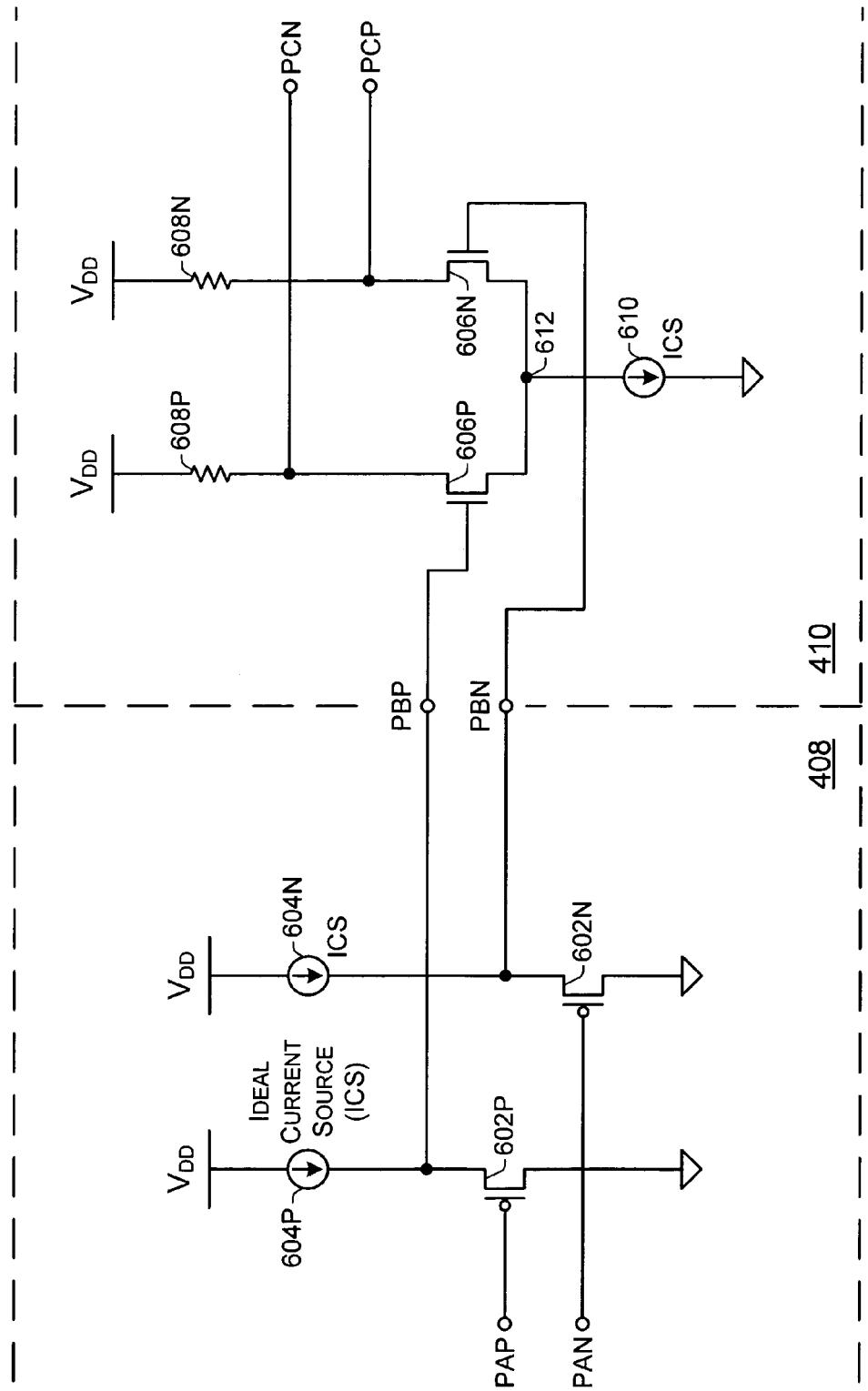
FIG. 6 illustrates an exemplary level shifter and an exemplary pre-amplifier for the RU of FIG. 4.

FIG. 6 illustrates an exemplary level shifter 408 and an exemplary pre-amplifier 410 for the RU of FIG. 4. As described above, ground-terminated signals at nodes PAP and PAN are level shifted as they propagate across level shifter 408 to nodes PBP and PBN. The level-shifted signals at nodes PBP and PBN are pre-amplified as they propagate across pre-amplifier 410 to nodes PCP and PCN.

In a described implementation, level shifter 408 includes a first transistor 602P, a second transistor 602N, a first ideal current source (ICS) 604P, and a second ICS 604N. As illustrated, ICS 604P is connected in series with transistor 602P in between a high magnitude or other supply voltage $V_{DD}$ and a common potential such as ground. Also, ICS 604N is connected in series with transistor 602N in between supply voltage $V_{DD}$ and the ground potential.

Specifically, ICS 604P is coupled between supply voltage $V_{DD}$ and node PBP, with the current flowing from supply voltage $V_{DD}$ toward node PBP. Transistor 602P is coupled between node PBP and the ground potential. Similarly, ICS 604N is coupled between supply voltage $V_{DD}$ and node PBN, with the current flowing from supply voltage $V_{DD}$ toward node PBN. Transistor 602N is coupled between node PBN and the ground potential.

Transistors 602P and 602N are illustrated as PMOS transistors, and each includes three terminals: a gate, a source, and a drain. The gate terminal of transistor 602P corresponds to node PAP, the source terminal corresponds to node PBP, and the drain terminal is coupled to the ground potential. Similarly, the gate terminal of transistor 602N corresponds to node PAN, the source terminal corresponds to node PBN, and the drain terminal is coupled to the ground potential.

Each ICS that is illustrated in the drawings and described herein may be implemented as a current source that is designed to operate within an acceptable approximation of ideal current source parameters. Such acceptable ideal current 11 source parameters depend both on the general intended application and on a current operational environment and/or situation. For example, ICS 604P and 604N may be implemented as appropriately biased PMOS transistors.

In operation, level shifter 408 increases the common mode voltage of differential signals as they propagate from nodes PAP and PAN to nodes PBP and PBN. This common mode voltage level shifting is accomplished using transistors 602P and 602N as biased by ICS 604P and 604N, respectively.

Differential signals are input to level shifter 408 at nodes PAP and PAN to the gate terminals of transistors 602P and 602N. Because transistors 602P and 602N are PMOS devices, they can handle low voltage (e.g., near zero-volt and negative voltage) inputs for a ground termination capability of an RU 306.

There is a predetermined relationship between the current flowing through and the voltage change across transistors 602P and 602N. Because the current flowing across transistors 602P and 602N is set by ICS 604P and 604N, respectively, the voltage change across transistors 602P and 602N is likewise established. There is also a relationship between the voltage at the gates of transistors 602P and 602N and the voltage at there respective sources, which is designated $V_{GS}$.

For transistor 602P, the gate voltage $V_G$ corresponds to node PAP, and the source voltage $V_S$ corresponds to node PBP. Equations 1 and 2 below indicate the voltage and current relationship for transistor 602P (and thus analogously for transistor 602N) that produce the voltage level shifting for level shifter 408.

$$I_{604P} = K(V_{PBP} - V_{PAP} - V_{THP})^2 \quad \text{(Eqn. 1)}$$

The constant "K" depends on the width and length of transistor 602P as well as device technology parameters. The current "$I_{604P}$" corresponds to the current produced by ICS 604P, and $V_{THP}$ represents the threshold voltage of transistor 602P. After some manipulation of equation 1, the following equation 2 is is produced:

$$V_{PBP} = \sqrt{\frac{I_{604P}}{K}} + V_{PAP} + V_{THP} \quad \text{(Eqn. 2)}$$

Thus, the voltage at node PBP is shifted upward with respect to the voltage at node PAP by an amount that is determined, at least partially, by the current established by ICS 604P. The analysis of the voltage and current relationships for transistor 602N, ICS 604N, and nodes PAN and PBN is analogous.

Transistors 602P and 602N, as biased by ICS 604P and 604N respectively, therefore shift the common mode voltage of differential signals that are input to nodes PAP and PAN as they propagate through level shifter 408 to nodes PBP and PBN.

There is usually, however, a gain that is associated with the level shifting of level shifter 408. It is typically a gain that is near one, but less than one due to the non-ideal nature of real-world current sources. Pre-amplifier 410 may be used to compensate for a gain of less than one that causes signal attenuation as the differential signals propagate from nodes PAP and PAN to nodes PBP and PBN.

As generally described above with reference to FIG. 4, level-shifted signals at nodes PBP and PBN are pre-amplified as they propagate across pre-amplifier 410 to nodes PCP and PCN. In a described implementation, pre-amplifier 410 I includes a first transistor 606P, a second transistor 606N, a first resistive element 608P, a second resistive element 608N, and an ICS 610.

As illustrated, resistive element 608P is connected in series with transistor 606P, and resistive element 608N is connected in series with transistor 606N. These two resistive element/transistor series are connected in parallel and coupled between supply voltage $V_{DD}$ and a node 612. An ICS 610 is connected in series with the two resistive element/transistor series between node 612 and the ground potential.

Specifically, resistive element 608P is coupled between supply voltage $V_{DD}$ and node PCN, and transistor 606P is coupled between node PCN and node 612. Similarly, resistive element 608N is coupled between supply voltage $V_{DD}$ and node PCP, and transistor 606N is coupled between node PCP and node 612. ICS 610 is coupled between node 612 and the ground potential.

Transistors 606P and 606N are illustrated as N-channel MOS (NMOS) transistors, and each also includes three terminals: a gate, a source, and a drain. The gate terminal of transistor 606P corresponds to node PBP, the drain terminal corresponds to node PCN, and the source terminal corresponds to node 612. Similarly, the gate terminal of transistor 606N corresponds to node PBN, the drain terminal corresponds to node PCP, and the source terminal corresponds to node 612.

In operation, pre-amplifier 410 increases the signal strength of the differential signals and may or may not change the common mode voltage as received from level shifter 408. Generally, the current established by ICS 610 is split or shared between transistors 606P and 606N as a function of the relative voltages at the gate terminals of the transistors.

The voltages that are output at nodes PCN and PCP are a function of this current splitting, the total current of ICS 610, the resistance values of resistive elements 608P and 608N, and the magnitude of the supply voltage $V_{DD}$. Specifically, the common mode voltage at nodes PCN and PCP may determined from equation 3:

$$V_{CM@PCN/PCP} = V_{DD} - I_{610} \cdot \frac{R_{608}}{2}, \quad \text{(Eqn. 3)}$$

where the current "$I_{610}$" corresponds to the current produced by ICS 610, and "$R_{608}$" represents the resistance value of resistive elements 608P and 608N.

Assuming that at a given moment a differential signal is voltage high at node PBP and voltage low at node PBN, NMOS transistor 606P is turned on more than NMOS transistor 606N. As a result, the resistance through transistor 606P is less than that of transistor 606N. Consequently, a larger percentage of the current from ICS 610 flows through transistor 606P as compared to transistor 606N. Because resistive elements 608P and 608N are in series with transistors 606P and 606N, a larger current flows through resistive element 608P as compared to the current flowing through resistive element 608N.

The larger current flowing through resistive element 608P causes a larger voltage drop across resistive element 608P as compared to that of resistive element 608N, assuming resistive elements 608P and 608N have at least approximately equal resistance values. This voltage drop difference results in node PCN being at a voltage low level and node PCP being at a voltage high level. An inverse voltage process occurs, and an opposite voltage state results at nodes PCN and PCP, when node PBP is at voltage low and node PBN is at voltage high.

Signal strength at nodes PCN and PCP is increased relative to the signal strength at nodes PBP and PBN by pre-amplifier 410. The amount of the signal strength increase may be adjusted by changing the current established by ICS 610. The differential signals that have been level-shifted and pre-amplified by level shifter 408 and pre-amplifier 410 are then forwarded at nodes PCN and PCP to data recovery circuitry 402 (of FIG. 4).

In FIG. 6 et seq., resistive elements are illustrated as resistors. However, other components may alternatively be used to implement such resistive elements. For example, a properly-biased PMOS transistor may be used as a resistive element when operated in its linear region. Similarly, transistors in FIG. 6 et seq. are illustrated as MOS transistors with specific channel types. However, other (e.g., opposite) channel types for MOS transistors may alternatively be used. Furthermore, other active devices may alternatively be employed. For example, bipolar junction transistors (BJTs) may be employed to implement the illustrated and described circuits.

Figure 7:
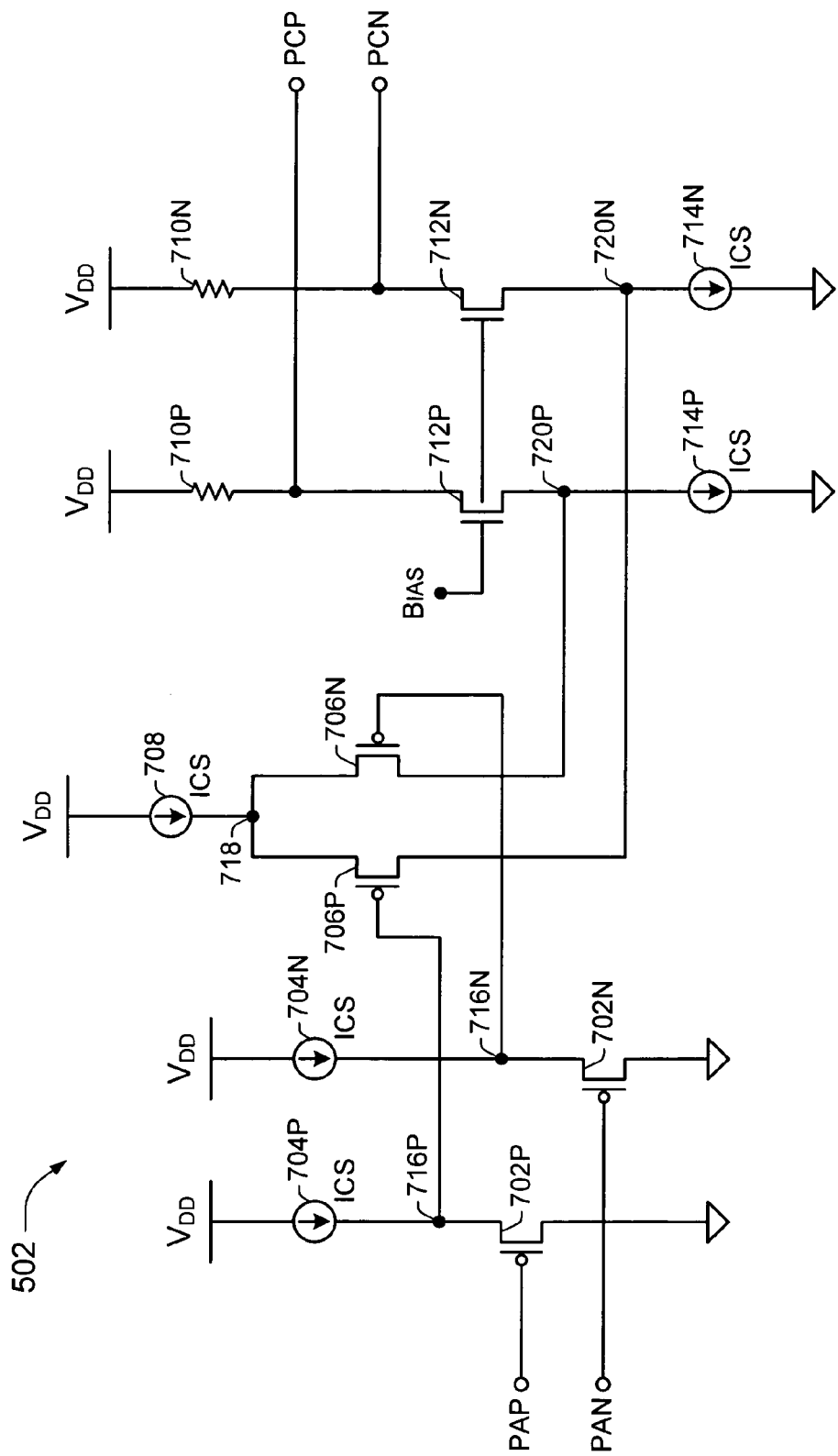
FIG. 7 illustrates an exemplary level shifter and pre-amplifier for the RU of FIG. 5.

FIG. 7 illustrates an exemplary level shifter and pre-amplifier 502 for the RU of FIG. 5. The combination level shifter and pre-amplifier 502 accepts signals as input at nodes PAP and PAN, shifts the level of the input signals, pre-amplifies the level-shifted signals, and provides the level-shifted and pre-amplified signals as output at nodes PCP and PCN.

Level shifter 408 and pre-amplifier 410 (of FIGS. 4 and 6) are implementable separately. In such a separate implementation, the common mode level of data signals at the output of level shifter 408 may already be set to optimum for data recovery circuitry 402 (and for pre-amplifier 410). Pre-amplifier 410 does not necessarily need to level-shift again. However, pre-amplifier 410 is included separately to amplify level-shifted signals to compensate for possible loss in the level-shifting operation. Furthermore, a separate pre-amplifier 410 facilitates implementation of a multi-mode RU when making the pre-amplifier selectable (e.g., by using a selectable pre-amplifier 812 as in FIGS. 8A and 8B). Even though further level shifting need not be performed after the stage of level shifter 408, the stage of pre-amplifier 410, as described above with reference to FIG. 6, may optionally change the common mode level of the data signals. This common mode level of the data signals that are output from pre-amplifier 410 is power-supply-referenced as indicated above by equation 3.

On the other hand, level shifter and pre-amplifier 502 performs both level-shifting and pre-amplifying operations. As described further below, level shifter and pre-amplifier 502 may be thought of as having three parts. For some IC processes, the first part of level shifter and pre-amplifier 502, which corresponds diagrammatically to level shifter 408, is not sufficient to bring the common mode level of the data signals to an optimum level. The second and third parts are therefore used to further level shift the signal (and also to pre-amplify the signal) to an optimum level. The common mode level of the data signals that are output from level shifter and pre-amplifier 502 is also power-supply-referenced as described further below.

Level shifter and pre-amplifier 502 may be considered to be divided into three general parts. Each part has two transistors, one for the positive portion of the differential signal and one for the negative portion. The first part includes transistors 702P and 702N and corresponds to level shifter 408 (of FIGS. 4 and 6). However, the outputs of this first part, instead of corresponding to nodes PBP and PBN of FIG. 6, are inputs to the second part of level shifter and pre-amplifier 502.

This second part of level shifter and pre-amplifier 502 includes transistors 706P and 706N. The second part of level shifter and pre-amplifier 502 transforms the voltage-based signals into intermediate signals that are current-based. These current-based signals are forwarded to the third part.

The third part of level shifter and pre-amplifier 502 includes transistors 712P and 712N. This third part of level shifter and pre-amplifier 502 transforms the current-based signals back into voltage-based signals. These voltage-based signals are provided as outputs at nodes PCP and PCN.

The first part of level shifter and pre-amplifier 502 is analogous to level shifter 408. Specifically, ICS 704P corresponds to ICS 604P, and ICS 704N corresponds to ICS 604N. Also, transistor 702P corresponds to transistor 602P, and transistor 702N corresponds to transistor 602N. With respect to output nodes, node 716P corresponds to node PBP, and node 716N corresponds to node PBN. Thus, voltage levels of differential signals at nodes PAP and PAN are level shifted by a predetermined amount at nodes 716P and 716N.

The second part of level shifter and pre-amplifier 502 accepts the level-shifted differential signals at nodes 716P and 716N. In the second part, an ICS 708 is coupled between supply voltage $V_{DD}$ and a node 718, with the current flowing toward node 718. Transistor 706P is coupled between nodes 718 and 720N, and transistor 706N is coupled between nodes 718 and 720P. For PMOS transistor 706P, a gate terminal corresponds to node 716P, a source terminal corresponds to node 718, and a drain terminal corresponds to node 720N. For PMOS transistor 706N, a gate terminal corresponds to node 716N, a source terminal corresponds to node 718, and a drain terminal corresponds to node 720P.

Generally, as the level-shifted differential signals are applied to transistors 11 706P and 706N, the current established by ICS 708 is split between them. This current splitting facilitates transformation of the voltage-based signals received at nodes 716P and 716N into current-based signals at nodes 720N and 720P, respectively.

In operation, the second part of level shifter and pre-amplifier 502 receives voltage-based signal inputs at nodes 716P and 716N and produces current-based signal outputs at nodes 720P and 720N. Assuming node 716P is voltage high and node 716N is voltage low, a larger percentage of the current from ICS 708 flows 19 through PMOS transistor 706N relative to PMOS transistor 706P. Consequently, a larger current is added at node 720P from the second part for the third part as compared to the current that is added at node 720N.

Nodes 720P and 720N may therefore be considered a juncture between the second and third parts of level shifter and pre-amplifier 502. The third part is organized into relatively separate halves that correspond to the positive and the negative portions of the differential signal. The third part includes two resistive elements 710P and 710N, two transistors 712P and 712N, and two ICS 714P and 714N. The two halves convert the current-based signals at nodes 720P and 720N back into voltage-based signals for outputting at nodes PCP and PCN, respectively.

For a first half of the third part of level shifter and pre-amplifier 502, resistive element 710P, transistor 712P, and ICS 714P are connected in series. Specifically, resistive element 710P is coupled between supply voltage $V_{DD}$ and node PCP, transistor 712P is coupled between nodes PCP and 720P, and ICS 714P is coupled between node 720P and the ground potential, with the current flowing toward the ground potential. For a second half, resistive element 710N, transistor 11 712N, and ICS 714N are connected in series. Specifically, resistive element 710N is coupled between supply voltage $V_{DD}$ and node PCN, transistor 712N is coupled between nodes PCN and 720N, and ICS 714N is coupled between node 720N and the ground potential, with the current flowing toward the ground potential.

For NMOS transistor 712P, a gate terminal is coupled to a bias signal, a source terminal corresponds to node 720P, and a drain terminal corresponds to node PCP. For NMOS transistor 712N, a gate terminal is coupled to a bias signal, a source terminal corresponds to node 720N, and a drain terminal corresponds to node PCN.

In operation of the third part of level shifter and pre-amplifier 502, transistors 712P and 712N are biased at their gate terminals to enable current to flow through them. Because each half is connected in series with ICS 714P or ICS 714N, the current through resistive elements 710P and 710N is a function of the current added to nodes 720P and 720N, respectively, from the second part. In other words, the sum of the current flowing through a respective resistive element 1710P and 710N and the current added at respective nodes 720P and 720N equals the current established by a respective ICS 714P and 714N.

In short, there is a current summing effect at nodes 720P and 720N that controls the current flowing across resistive elements 710P and 710N. For example, when a larger current is being added at node 720P as compared to that being added at node 720N, a smaller current is flowing through resistive element 710P as compared to that flowing through resistive element 710N. Consequently, the voltage drop across resistive element 710P is less than the voltage drop across resistive element 710N. In this example, node PCP is therefore at voltage high, and node PCN is at voltage low.

The differential signals output at nodes PCP and PCN from level shifter and pre-amplifier 502 are thus set with reference to supply voltage $V_{DD}$. In other words, level shifter and pre-amplifier 502 level shifts and pre-amplifies differential signals that are input at nodes PAP and PAN and effectively sets the common mode voltage of the differential signals that are output at nodes PCP and PCN to a desired level between supply voltage $V_{DD}$ and ground.

The first part of level shifter and pre-amplifier 502 performs the level-shifting operation for signals that are received and terminated at DC ground. The second and third parts provide a gain and set a common mode voltage for the output differential signals. Together, they increase both the signal swing or gain and the common mode voltage.

The gain of level shifter and pre-amplifier 502 may be determined using a transconductance "$g_m$" of transistors 706P and 706N and a resistance value "$R_{710}$" of resistive elements 710P and 710N. Equation 4 below indicates the gain:

$$\text{Gain} = g_m \square R_{710} \quad \text{(Eqn. 4)}.$$

The common mode voltage "$V_{CM}$" of the output of level shifter and pre-amplifier 502 at nodes PCP and PCN is provided below in equation 5:

$$V_{CM@PCP/PCN} = V_{DD} - \left(\left(I_{714} - \frac{I_{708}}{2}\right)\square R_{710}\right), \quad \text{(Eqn. 5)}$$

typically $I_{714} = I_{708}$, where current "$I_{714}$" corresponds to the current produced by ICS 714P and 714N, current "$I_{708}$" corresponds to the current produced by ICS 708, and "$R_{710}$" represents the resistance value of resistive elements 710P and 710N. Hence, level shifter and pre-amplifier 502 can be used to receive ground-terminated input signals, to level shift the input signals, to increase the strength of the level-shifted signals by a predetermined gain, and to output the strengthened signals at a predetermined common mode voltage.

A circuit and scheme for level shifting signals downward that is similar and/or analogous to that of FIG. 7 is illustrated and described in a copending United States Application for Letters Patent that is entitled "Technique for Voltage Level Shifting in Input Circuitry" and that has been assigned Ser. No. 10/237,963. This application Ser. No. 10/237,963 to Wang et al. was filed on Sep. 10, 2002, and is commonly assigned with the instant Patent Application.

Figure 8A:
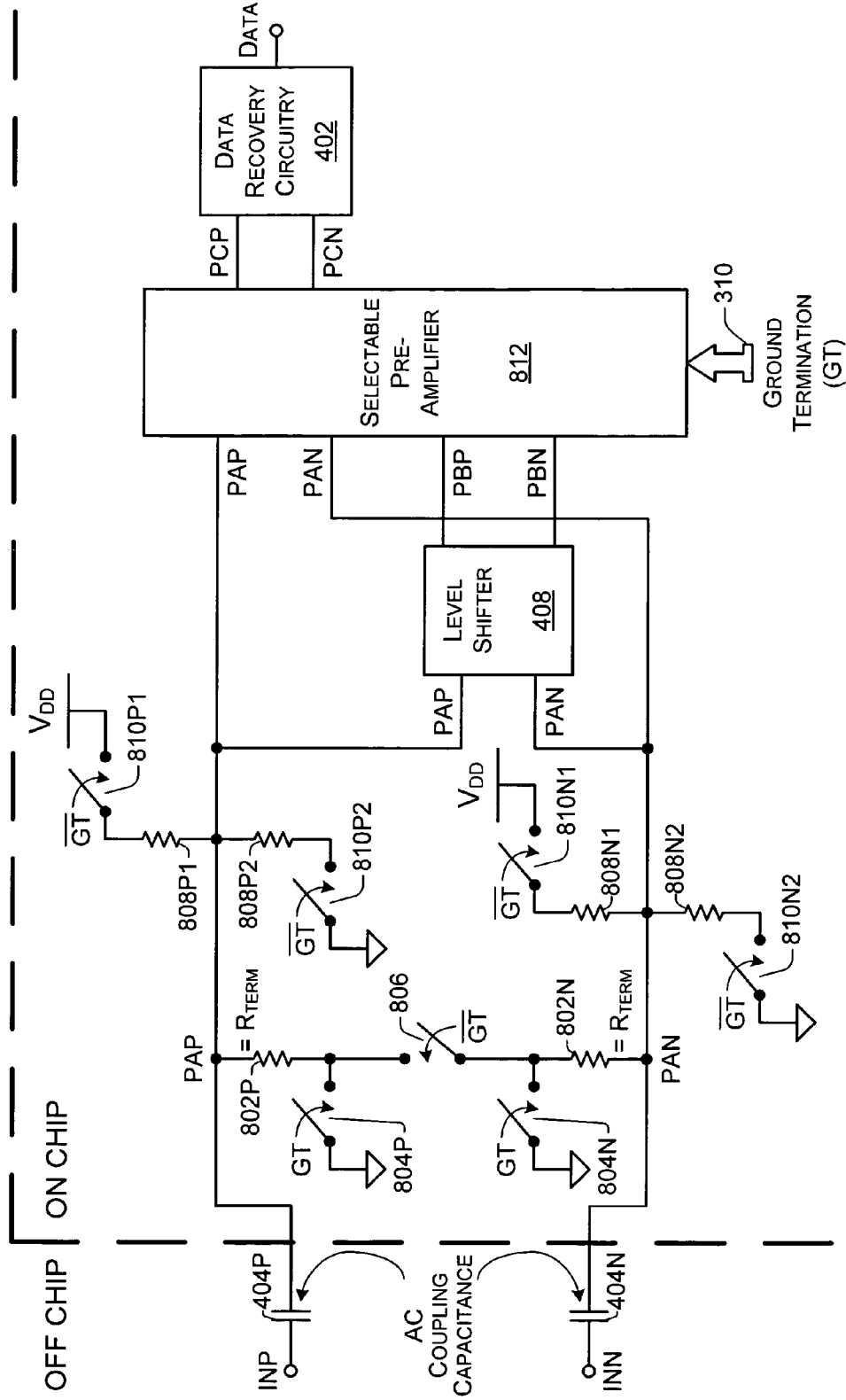
FIG. 8A illustrates a first exemplary multi-mode RU that includes a level shifter, a selectable pre-amplifier, and data recovery circuitry.

FIG. 8A illustrates a first exemplary on-chip multi-mode RU that includes a level shifter 408, a selectable pre-amplifier 812, and data recovery circuitry 402. The RU may be operated in at least two modes as determined by mode select input 310. Mode select input 310 is applied to selectable pre-amplifier 812 to selectably bypass level shifter 408 and to multiple switches to establish different switching configurations.

In a described implementation, the on-chip RU may be operated in a ground termination (GT) mode and a non-ground termination mode. For example, the ground termination mode may correspond to a PCI Express-compliant mode, and the non-ground termination mode may correspond to a PECL-compliant mode. Generally, the ground termination mode enables input signals to have a zero-volt or other ground-level common mode voltage without using on-chip AC coupling capacitance, and the non-ground termination mode enables input signals to have a sufficiently high common mode voltage so as to permit larger signal swings.

For the illustrated circuit generally, termination (resistive) elements 802P and 802N may be switched into different configurations depending on the receiving mode. A first voltage divider 808P and a second voltage divider 808N are switched into an operable configuration when in a non-ground termination mode. Because of the ground termination mode input 310 at selectable pre-amplifier 812, level-shifting from level shifter 408 is applied to the data-encoded signals that are ultimately forwarded to nodes PCP and PCN when in the ground termination mode. An exemplary selectable pre-amplifier 812 is described further below with reference to FIG. 10. In either mode, selectable pre-amplifier 812 pre-amplifies signals prior to forwarding them to data recovery circuitry 402.

Resistive element 802P, which is coupled to node PAP, is connected in series with both a switch 806 and resistive element 802N, which is coupled to node PAN. A switch 804P is coupled between ground and a node that is located between resistive element 802P and switch 806. A switch 804N is coupled between ground and a node that is located between resistive element 802N and switch 806.

A resistive element 808P1 is connected in series with a switch 810P1 between supply voltage $V_{DD}$ and node PAP, with resistive element 808P1 coupled to node PAP. A resistive element 808P2 is connected in series with a switch 810P2 between ground and node PAP, with resistive element 808P2 coupled to node PAP. Resistive elements 808P1 and 808P2, along with switches 810P1 and 810P2, form a switched voltage divider 808/810P. In operation, switched voltage divider 808/810P effectively functions to selectively establish a voltage level that is above ground.

A resistive element 808N1 is connected in series with a switch 810N1 between supply voltage $V_{DD}$ and node PAN, with resistive element 808N1 coupled to node PAN. A resistive element 808N2 is connected in series with a switch 810N2 between ground and node PAN, with resistive element 808N2 coupled to , node PAN. Resistive elements 808N1 and 808N2, along with switches 810N1 and 810N2, form a switched voltage divider 808/810N. The switches shown in FIG. 8A et seq. may be implemented as, for example, a transmission gate.

A level shifter 408 is coupled between nodes PAP and PAN and nodes PBP and PBN, with nodes PAP and PAN carrying the differential signal inputs and with nodes PBP and PBN carrying the level-shifted differential signal outputs. Selectable pre-amplifier 812 receives two sets of inputs at (i) nodes PAP and PAN and (ii) nodes PBP and PBN. A third input, ground termination input 310, selects between the two sets of inputs. Selectable pre-amplifier 812 produces outputs at nodes PCP and PCN. Data recovery circuitry 402 receives inputs at nodes PCP and PCN and provides the recovered data at its output.

In accordance with a first or ground termination mode, operation of the on-chip RU of FIG. 8A is as follows. A ground termination selection for mode input 310 causes switches 804P and 804N to be closed and switches 806, 810P1, 810P2, 810N1, and 810N2 to be open. As a first result, input lines INP and INN are terminated by resistive elements 802P and 802N that are each coupled to ground. As a second result, switched voltage dividers 808/810 are switched into a deactivated or non-functional configuration that enables nodes PAP and PAN to be at DC ground for incoming signals such as differential signals.

Level shifter 408 therefore receives as input differential signals at nodes PAP and PAN that have a zero-volt, in this described implementation, common II mode voltage. Level shifter 408 shifts the voltage levels of the differential signals to increase the common mode voltage thereof prior to outputting them at nodes PBP and PBN.

A ground termination selection for mode input 310 additionally causes selectable pre-amplifier 812 to select the PBP and PBN inputs (and to de-select or ignore the inputs at nodes PAP and PAN). As a result, the level-shifted differential signals at nodes PBP and PBN are pre-amplified by selectable pre-amplifier 812 and provided as outputs at nodes PCP and PCN. The level-shifted and pre-amplified differential signals are accepted as input at nodes PCP and PCN by data recovery circuitry 402, which recovers and outputs the data encoded in the differential signals.

In accordance with a second or non-ground termination mode, operation of the on-chip RU of FIG. 8A is as follows. A non-ground termination selection for mode input 310 causes switches 804P and 804N to be open and switches 806, 810P1, 810P2, 810N1, and 810N2 to be closed. As a first result, input lines INP and INN are terminated by resistive elements 802P and 802N that are connected in series and coupled at nodes PAP and PAN. As a second result, switched voltage dividers 808/810 are switched into an activated or functional configuration. This functional configuration enables the DC voltage level of nodes PAP and PAN to be set using resistive elements 808 to a desired level above ground (or below ground if supply voltage $V_{DD}$ is negative).

A non-ground termination selection for mode input 310 additionally causes selectable pre-amplifier 812 to select the PAP and PAN inputs (and to de-select or ignore the inputs at nodes PBP and PBN and thus to bypass level shifter 408). As a result, the differential signals at nodes PAP and PAN are pre-amplified by selectable pre-amplifier 812 and provided as outputs at nodes PCP and PCN. The pre-amplified differential signals are accepted as input at nodes PCP and PCN by data recovery circuitry 402, which recovers and outputs the data encoded in the differential signals.

Figure 8B:
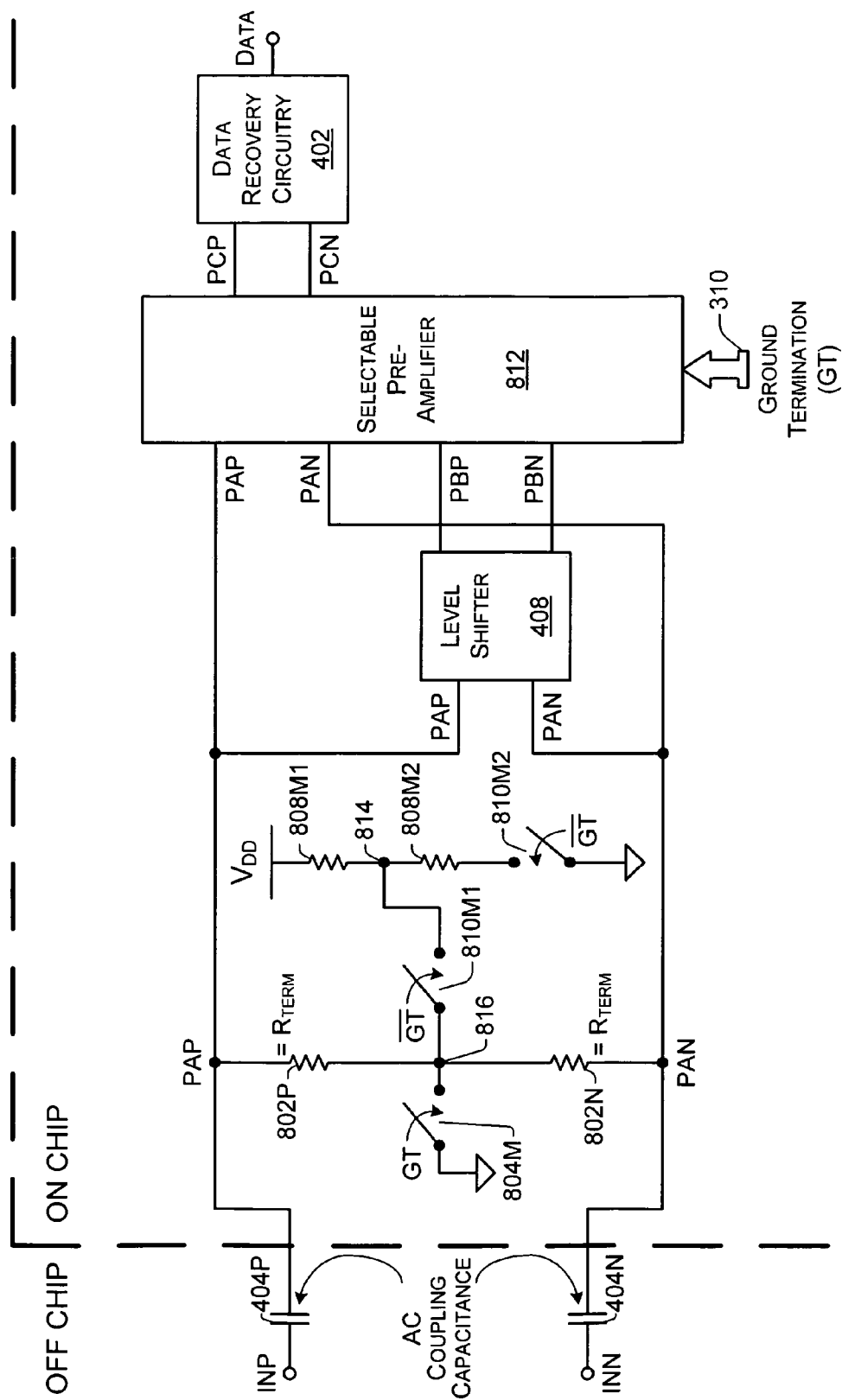
FIG. 8B illustrates a second exemplary multi-mode RU that includes a level shifter, a selectable pre-amplifier, and data recovery circuitry.

FIG. 8B illustrates a second exemplary on-chip multimode RU that includes a level shifter 408, a selectable pre-amplifier 812, and data recovery circuitry 402. The circuitry and operation of FIG. 8B is similar to that of FIG. 8A, except for available switching configurations and the applicable switched voltage divider. Termination elements 802P and 802N are connected in series between nodes PAP and PAN, with termination element 802P coupled to node PAP and termination element 802N coupled to node PAN. A switch 804M is coupled between ground and a node 816, which is located between termination elements 802P and 802N.

A resistive element 808M1 is connected in series with a resistive element 808M2 and a switch 810M2 between supply voltage $V_{DD}$ and ground, with resistive element 808M1 coupled to supply voltage $V_{DD}$ and switch 810M2 coupled to ground. More specifically, resistive element 808M1 is coupled between supply voltage $V_{DD}$ and a node 814. Resistive element 808M2 is connected in series with switch 810M2 between node 814 and ground, with resistive element 808M2 coupled to node 814.

A switch 810M1 is coupled between node 814 and node 816. Resistive elements 808M1 and 808M2, along with switches 810M1 and 810M2, form a switched voltage divider 808/810M. In operation, switched voltage divider 808/810M effectively functions to selectively establish a voltage level that is above ground at nodes PAP and PAN by setting the voltage level at node 816.

In accordance with a first or ground termination mode, operation of the on-chip RU of FIG. 8B is as follows. A ground termination selection for mode input 310 causes switch 804M to be closed and switches 810M1 and 810M2 to be open. As a first result, input lines INP and INN are terminated by resistive elements 802P and 802N that are each coupled to ground. As a second result, switched voltage divider 808/810M is switched into a deactivated or non-functional configuration that enables nodes PAP and PAN to be at DC ground for incoming signals such as differential signals.

Operation of level shifter 408, selectable pre-amplifier 812, and data recovery circuitry 402 is comparable to the operation for the ground termination mode that is described above with reference to FIG. 8A. In short, under control of mode input 310, signals received at a ground termination are level-shifted by level shifter 408 and pre-amplified by selectable pre-amplifier 812. These level-shifted and pre-amplified signals are provided to data recovery circuitry 402.

In accordance with a second or non-ground termination mode, operation of the on-chip RU of FIG. 8B is as follows.

A non-ground termination selection for mode input 310 causes switch 804M to be open and switches 810M1 and 810M2 to be closed. As a first result, input lines INP and INN are terminated by resistive elements 802P and 802N that are connected in series and coupled to nodes PAP and PAN, respectively. As a second result, switched voltage divider 808/810M is switched into an activated or functional configuration. This functional configuration enables the DC voltage level of nodes PAP and PAN to be set using resistive elements 808M to a desired level above ground (or below ground if supply voltage $V_{DD}$ is negative).

Operation of level shifter 408, selectable pre-amplifier 812, and data recovery circuitry 402 is comparable to the operation for the non-ground termination mode that is described above with reference to FIG. 8A. In short, under control of mode input 310, signals received at a non-ground termination bypass level shifter 408 and are pre-amplified by selectable pre-amplifier 812. These pre-amplified signals are provided to data recovery circuitry 402.

Figure 9A:
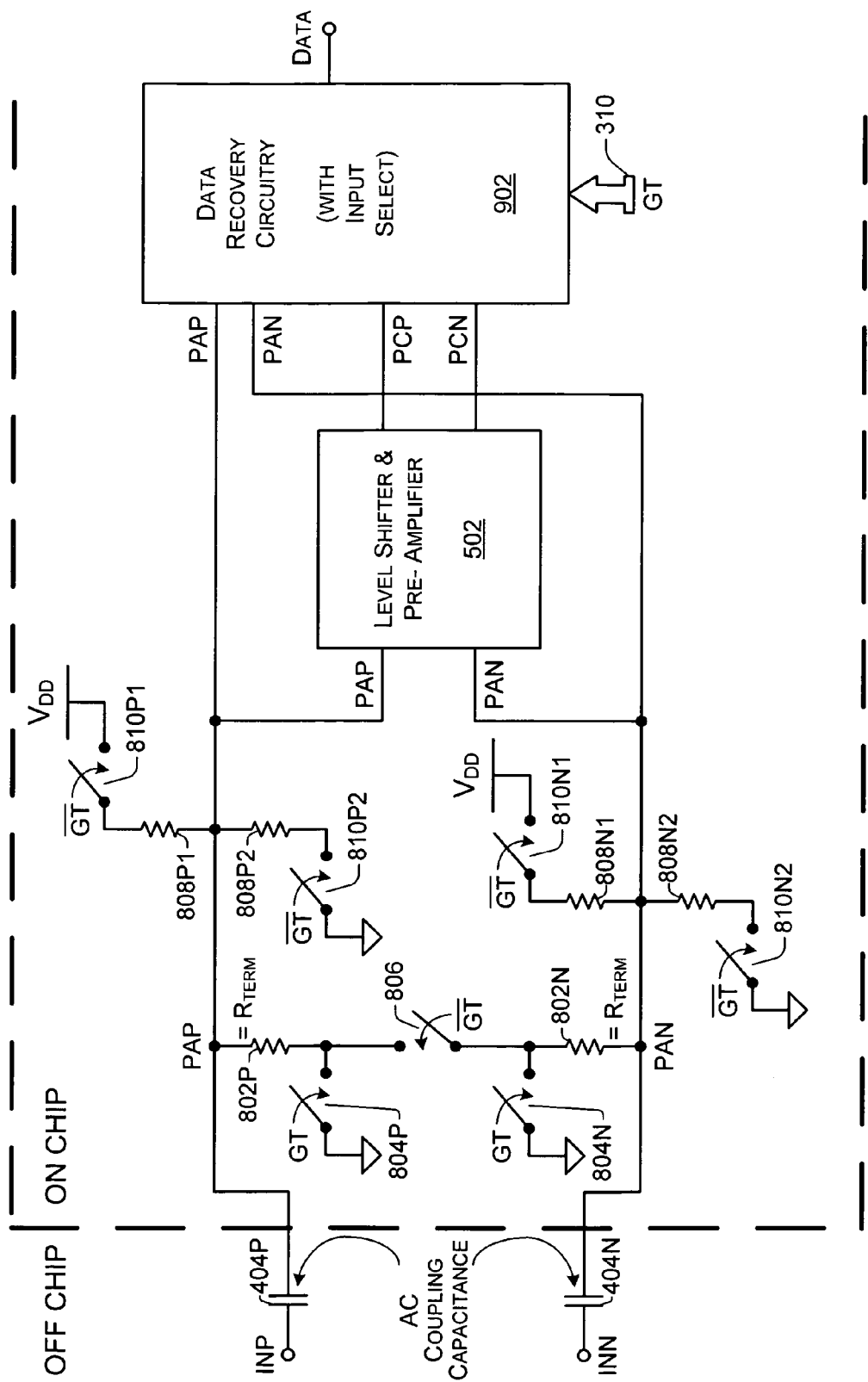
FIG. 9A illustrates a first exemplary multi-mode RU that includes a level shifter and pre-amplifier and selectable data recovery circuitry.

FIG. 9A illustrates a first exemplary on-chip multi-mode RU that includes a level shifter and pre-amplifier 502 and selectable data recovery circuitry 902. The RU may be operated in at least two modes as determined by mode select input 310. Mode select input 310 is applied to data recovery circuitry that has an input select (i.e., selectable data recovery circuitry 902) to selectably bypass level shifter and pre-amplifier 502 and to multiple switches to establish different switching configurations.

In a described implementation, operation of the on-chip RU of FIG. 9A is comparable to that of the on-chip RU of FIG. 8A, including the ability to have ground termination and non-ground termination modes. However, level shifter 408, selectable pre-amplifier 812, and data recovery circuitry 402 are replaced by level shifter and pre-amplifier 502 and selectable data recovery circuitry 902. An exemplary selectable data recovery circuitry 902 is described further below with reference to FIG. 12.

Generally, level shifter and pre-amplifier 502 receives ground-terminated inputs at nodes PAP and PAN and provides level-shifted and pre-amplified outputs at nodes PCP and PCN. Selectable data recovery circuitry 902 processes non-ground-terminated inputs at nodes PAP and PAN in a non-ground termination mode and level-shifted and pre-amplified outputs at nodes PCP and PCN in a ground termination mode in accordance with mode select input 310.

Consequently, signals received for the non-ground termination mode are not pre-amplified prior to their application to selectable data recovery circuitry 902. It should be noted that level shifter and pre-amplifier 502 may alternatively be replaced with level shifter 408 and pre-amplifier 410 such that the input nodes of selectable data recovery circuitry 902 are otherwise unchanged with regard to those illustrated in FIG. 9A.

In accordance with a first or ground termination mode, operation of the on-chip RU of FIG. 9A is as follows. With regard to switches 804P, 804N, 806, 810P1, 810P2, 810N1, and 810N2, they are opened and closed in the same manner as described above with reference to FIG. 8A for the ground termination mode. Consequently, level shifter and pre-amplifier 502 receives as input differential signals at nodes PAP and PAN that have an at least approximately zero-volt, in this described implementation, common mode voltage. Level shifter and pre-amplifier 502 level-shifts and pre-amplifies the input differential signals, as described above with reference to FIGS. 5 and 7, prior to outputting them at nodes PCP and PCN.

A ground termination selection for mode input 310 additionally causes selectable data recovery circuitry 902 to select the PCP and PCN inputs (and to de-select or ignore the inputs at nodes PAP and PAN). As a result, the level-shifted and pre-amplified differential signals are accepted as input at nodes PCP and PCN by selectable data recovery circuitry 902. Selectable data recovery circuitry 902 recovers the data encoded in the differential signals and provides the data at its output. As described above with reference to data recovery circuitry 402 (of FIG. 4), selectable data recovery circuitry 902 may be implemented as one or more of a sampler, a slicer, and so forth.

In accordance with a second or non-ground termination mode, operation of the on-chip RU of FIG. 9A is as follows. Switches 804P, 804N, 806, 810P1, 810P2, 810N1, and 810N2 operate in the same manner as for the non-ground termination mode of FIG. 8A. As a result, the signals received over lines INP and IN are terminated with a common mode voltage as set by switched voltage dividers 808/810P and 808/810N.

A non-ground termination selection for mode input 3 10 additionally causes selectable data recovery circuitry 902 to select the PAP and PAN inputs (and to de-select or ignore the inputs at nodes PCP and PCN and thus to bypass level shifter and pre-amplifier 502). As a result, the differential signals at nodes PAP and PAN are accepted as input to selectable data recovery circuitry 902. Selectable data recovery circuitry 902 recovers the data encoded in the differential signals at its input and provides the data at its output.

Figure 9B:
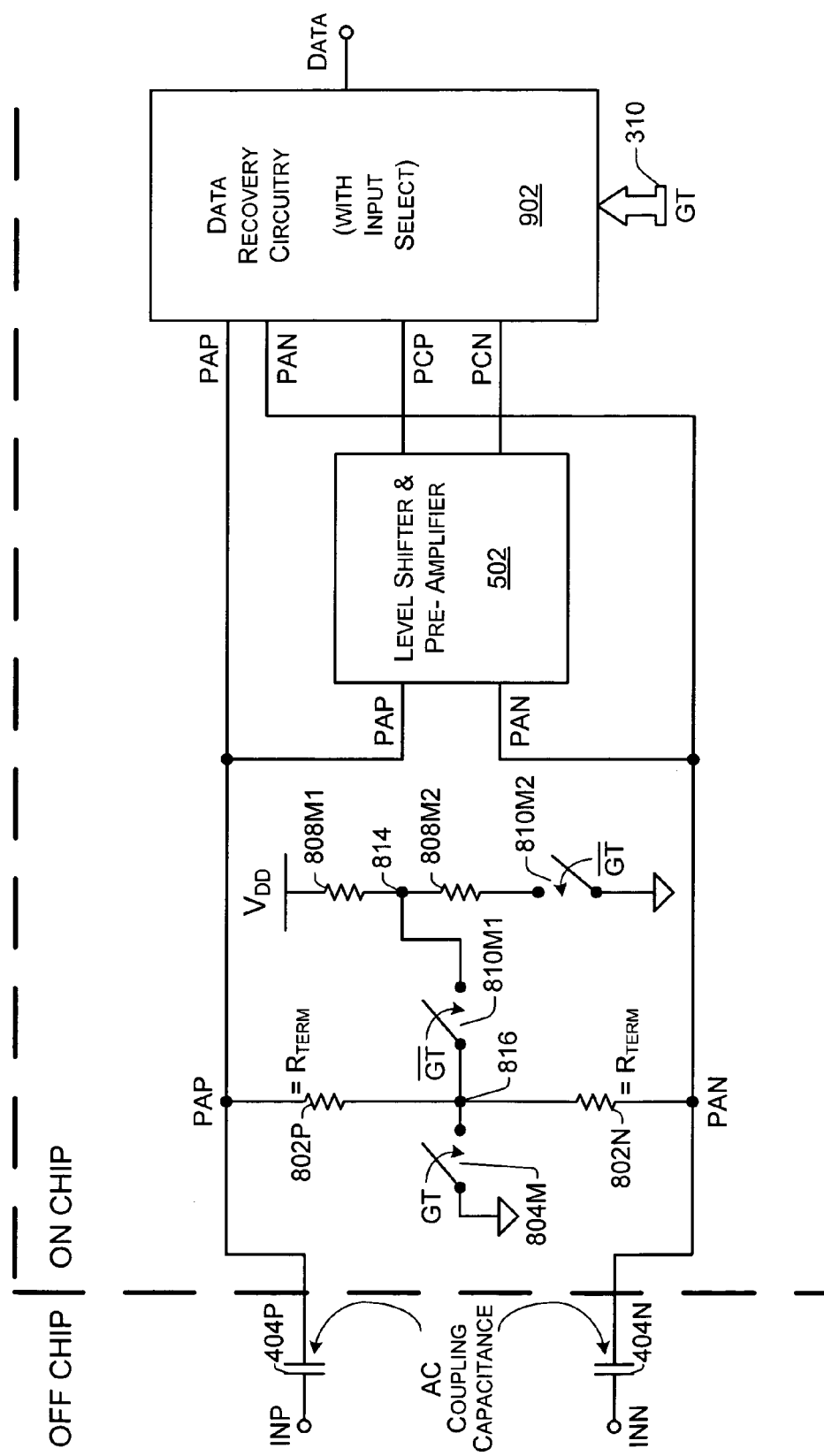
FIG. 9B illustrates a second exemplary multi-mode RU that includes a level shifter and pre-amplifier and selectable data recovery circuitry.

FIG. 9B illustrates a second exemplary multi-mode RU that includes a level shifter and pre-amplifier 502 and selectable data recovery circuitry 902. The circuitry and operation of FIG. 9B is similar to that of FIG. 9A, except for available switching configurations and the applicable switched voltage divider. However, these switching configurations and switched voltage divider are described above with reference to FIG. 8B.

Specifically, termination elements 802P and 802N are connected in series between nodes PAP and PAN with node 816 therebetween. Switch 804M is coupled between node 816 and ground. Also, a switched voltage divider 808/810M is coupled to node 816. Switched voltage divider 808/810M includes resistive elements 808M1 and 808M2 along with switches 810M1 and 810M2.

In accordance with a first or ground termination mode, switched voltage divider 808/810M is switched into an inactive configuration and switch 804M is closed to provide a ground termination at nodes PAP and PAN. In accordance with a second or non-ground termination mode, switched voltage divider 808/810M is switched into an active configuration and switch 804M is opened to permit a non-ground termination to be established at nodes PAP and PAN by an activated switched voltage divider 808/810M. The interaction and operation of level shifter and pre-amplifier 502 and selectable data recovery circuitry 902 for each of these two signal receiving modes are comparable to the description provided above with reference to FIG. 9A.

Figure 10:
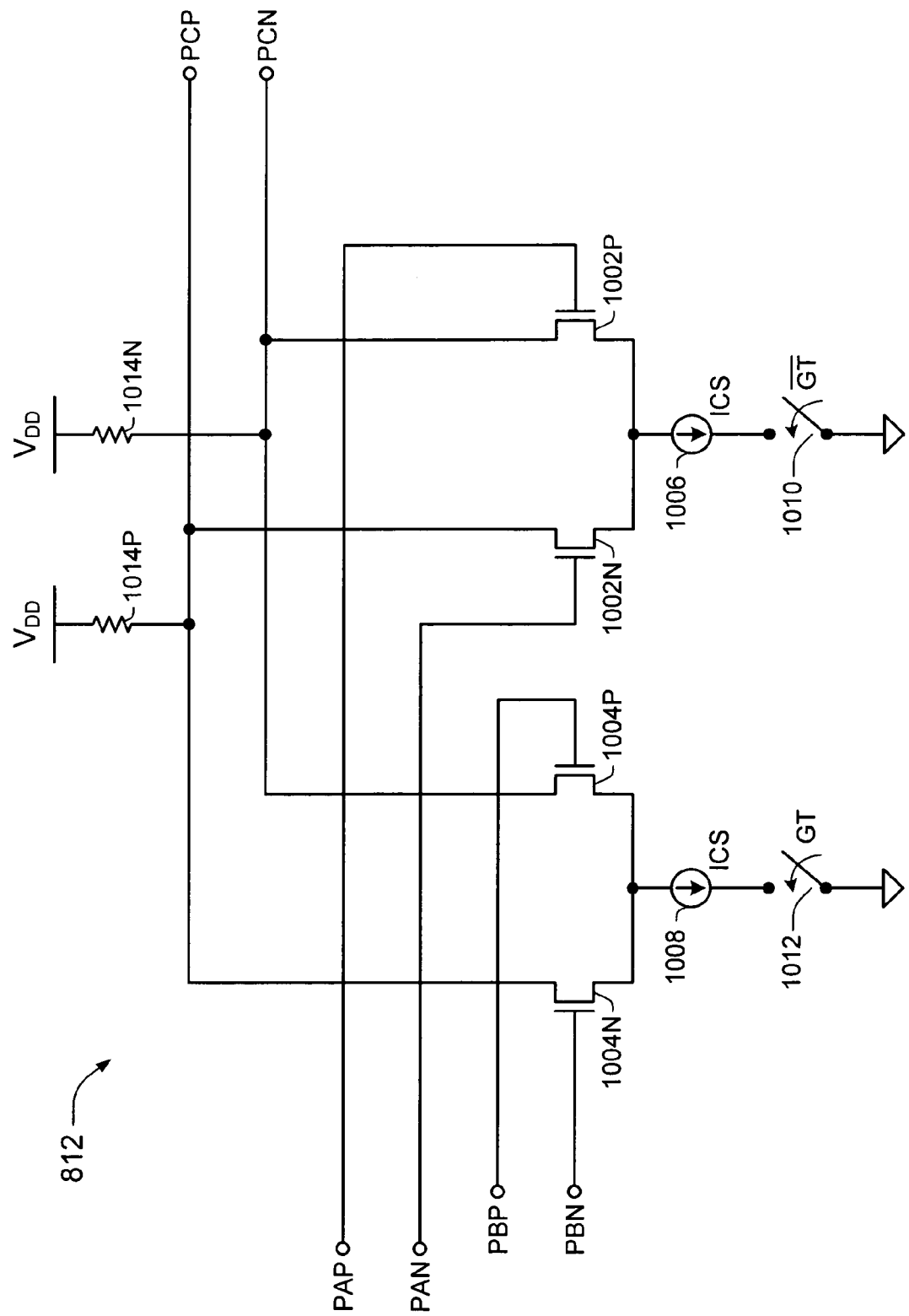
FIG. 10 illustrates an exemplary selectable pre-amplifier for the RU of FIGS. 8A and 8B.

FIG. 10 illustrates an exemplary selectable pre-amplifier 812 for the RUs of FIGS. 8A and 8B. Inputs PAP and PAN are provided to a first differential amplifier pair on the "right", and inputs PBP and PBN are provided to a second differential amplifier pair on the "left". Outputs PCP and PCN are routed from both the first differential amplifier pair and the second differential amplifier pair as selected by ground/non-ground termination mode input 310 (not explicitly shown in FIG. 10).

The first differential amplifier pair includes transistors 1002N and 1002P, an ICS 1006, and a switch 1010. The second differential amplifier pair includes transistors 1004N and 1004P, an ICS 1008, and a switch 1012. The first and second differential amplifier pairs "share" two resistive elements 1014P and 1014N that bias the output common mode voltage at nodes PCP and PCN in conjunction with the current established by ICS 1006 and 1008.

Generally, each of the first and second differential amplifier pairs is connected and operates analogously to pre-amplifier 410 of FIG. 6. However, the first and second differential amplifier pairs are alternately switched into operation using switches 1010 and 1012. Switch 1010 is coupled between ICS 1006 and the ground potential, and switch 1012 is coupled between ICS 1008 and the ground potential. Switches 1010 and 1012 can therefore control whether the current established by ICS 1006 and 1008 flows through the respective transistors of the first and second differential amplifier pairs.

In accordance with a first or ground termination mode, switch 1012 is closed and switch 1010 is open. Consequently, inputs PBP and PBN to the second differential amplifier pair are pre-amplified, as described above with reference to FIG. 6, and provided as outputs PCP and PCN.

In accordance with a second or non-ground termination mode, switch 1010 is closed and switch 1012 is open. Consequently, inputs PAP and PAN to the first differential amplifier pair are pre-amplified and provided as outputs PCP and PCN for receipt and/or sampling, slicing, etc. by data recovery circuitry 402 (of FIGS. 8A and 8B).

Figure 11:
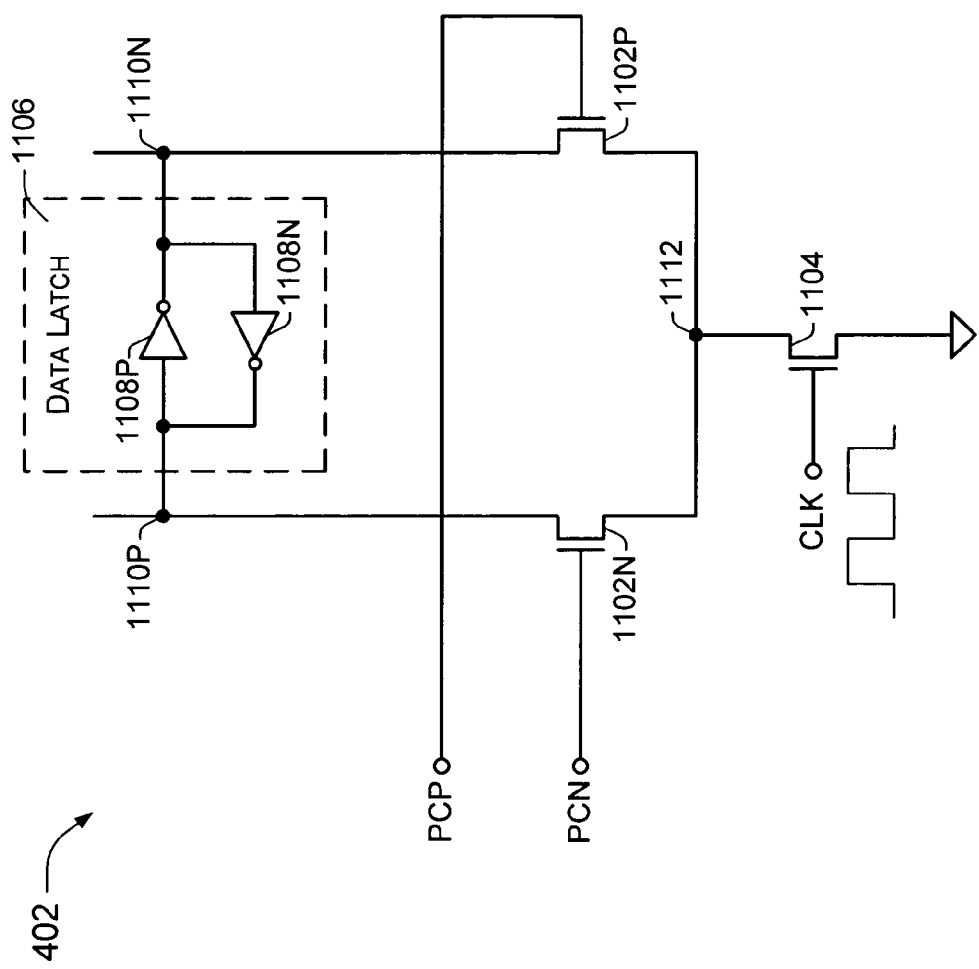
FIG. 11 illustrates exemplary data recovery circuitry for the RU of FIGS. 4, 5, 8A, and 8B.

FIG. 11 illustrates exemplary data recovery circuitry 402 for the on-chip RU of FIGS. 4, 5, 8A, and 8B. Exemplary data recovery circuitry 402 is illustrated in FIG. 11 and described below as a sampler implementation of general data recovery circuitry 402. Inputs PCP and PCN provide the incoming signals for eventual latching by a data latch 1106.

Data recovery circuitry 402 includes, in addition to data latch 1106, transistors 1102P, 1102N, and 1104. Transistors 1102P and 1102N accept inputs PCP and PCN, and transistor 1104 accepts a clock input. Generally, data latch 11 1106 latches the signaled data via transistors 1102P and 1102N according to the clock input.

As illustrated, data latch 1106 is coupled between nodes 1110P and 1110N. Transistor 1102N is coupled between node 1110P and a node 1112, and transistor 1102P is coupled between node 1110N and node 1112. Transistor 1104 is coupled between node 1112 and ground.

Data latch 1106 includes two inverters 1108P and 1108N that are connected in parallel in a head-to-toe manner in order to capture voltage levels output by transistors 1102N and 1102P. Inverter 1108P is coupled to node 1110P at its input and to node 1110N at its inverted output. Inverter 1108N, on the other hand, is coupled to node 1110N at its input and to node 1110P at its inverted output. It should be noted that data latch 1106 may be implemented using circuitry that differs from the exemplary circuitry illustrated in FIG. 11 and described herein. Thus, any general data latch implementation may alternatively be employed.

In a described implementation with differential signaling, a positive portion of the signal is input to a gate terminal of transistor 1102P from node PCP. A negative portion of the signal is input to a gate terminal of transistor 1102N from node PCN. The clock input at the gate terminal of transistor 1104 enables current to flow through at least one of transistors 1102P and 1102N at appropriate intervals.

This current flow enables data to be latched at data latch 1106. For example, with node PCP at voltage high and node PCN at voltage low, data latch 1106 latches a high voltage at node 1110P and a low voltage at node 1110N. These voltage levels at data latch 1106 can then be appropriately interpreted.

Figure 12:
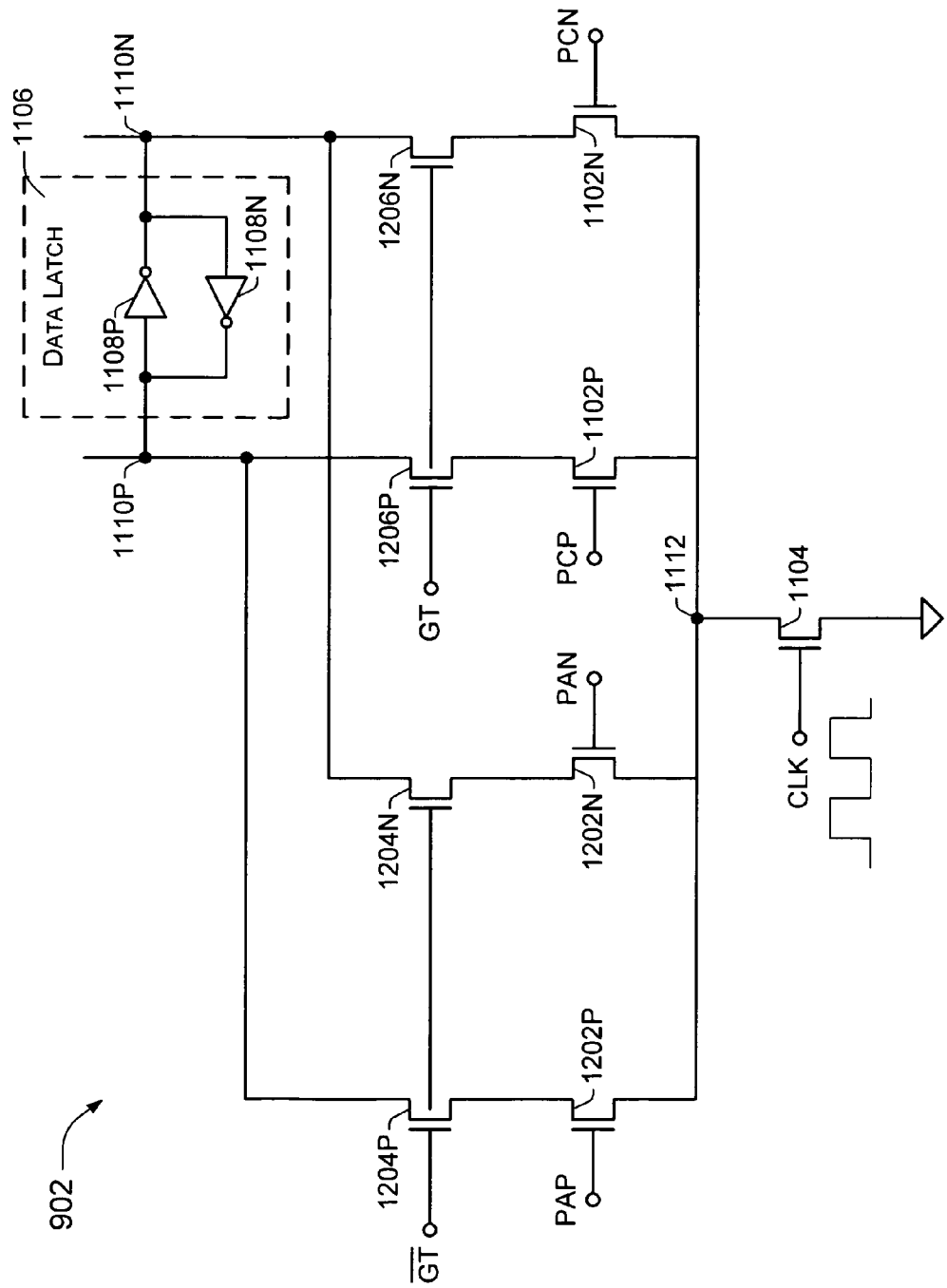
FIG. 12 illustrates exemplary selectable data recovery circuitry for the RU of FIGS. 9A and 9B.

FIG. 12 illustrates exemplary selectable data recovery circuitry 902 for the on-chip RUs of FIGS. 9A and 9B. Exemplary selectable data recovery circuitry 902 is illustrated in FIG. 12 and described below as a sampler implementation of general selectable data recovery circuitry 902. Selectable data recovery circuitry 902 receives two sets of inputs and latches the selected set responsive to mode selection input 310 (not explicitly shown in FIG. 12) as indicated by the ground termination and non-ground termination input nodes.

In a described implementation, selectable data recovery circuitry 902 is similar to the non-selectable data recovery circuitry 402 of FIG. 11. However, there are several additional components and input nodes. Two transistors 1202P and 1202N are coupled to node 1112. A positive portion of a differential signal is input to a gate terminal of transistor 1202P from node PAP, and a negative portion of the signal is input to a gate terminal of transistor 1202N from node PAN.

Four transistors 1204P, 1204N, 1206P, and 1206N are added to implement the mode selection. Transistors 1204P and 1206P are connected in series with transistors 1202P and 1102P, respectively, in between nodes 110P and 1112, with transistors 1204P and 1206P coupled to node 1110P. Transistors 1204N and 1206N are connected in series with transistors 1202N and 1102N, respectively, in between nodes 1110N and 1112, with transistors 1204N and 1206N coupled to node 1110N. A ground termination mode selection input is coupled to the gates of transistors 1206P and 1206N. A non-ground termination mode selection input is coupled to the gates of transistors 1204P and 1204N.

In accordance with a first or ground termination mode, transistors 1206P and 1206N are biased to permit current to flow through them so that differential signals at nodes PCP and PCN may be latched by data latch 1106. In accordance with a second or non-ground termination mode, transistors 1204P and 1204N are biased to permit current to flow through them so that differential signals at nodes PAP and PAN may be latched by data latch 1106. In either case, selectable data recovery circuitry 902 enables ground termination/non-ground termination mode selection to be performed at a sampling/slicing/etc. stage and, for example, after a pre-amplifier stage.

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

What is claimed is:

1. An apparatus comprising:
   signal input receiver circuitry to receive differential input signals according to a selectable differential termination mode, the signal input receiver circuitry including:
   at least two signal inputs to receive the differential input signals; and
   a mode select input to receive a mode signal and to select, in response to the mode signal, a first or a second differential termination mode;

wherein a termination voltage level of the signal input receiver circuitry is set to a first level when the first differential termination mode is selected and the termination voltage level of the signal input receiver circuitry is set to a second level when the second differential termination mode is selected.

2. The apparatus as recited in claim 1, wherein the first level comprises a ground termination level, and the second level comprises a non-ground termination level.

3. The apparatus as recited in claim 1, wherein the signal input receiver circuitry further includes:
a switch to enable activation of the first differential termination mode or the second differential termination mode.

4. The apparatus as recited in claim 3, wherein selection of the first differential termination mode causes the switch to be in a first configuration that results in the at least two signal inputs providing the termination voltage level at the first level for the differential input signals, and selection of the second differential termination mode causes the switch to be in a second configuration that results in the at least two signal inputs providing the termination voltage level at the second level for the differential input signals.

5. The apparatus as recited in claim 1, wherein the signal input receiver circuitry further includes:
data recovery circuitry that recovers data from the differential input signals.

6. The apparatus as recited in claim 1, wherein the signal input receiver circuitry further includes:
a level shifter to receive the differential input signals upon selection of the first differential termination mode and to produce a voltage level
shifted signal that corresponds to the differential input signals.

7. The apparatus as recited in claim 6, wherein the voltage level shifted signal has a common mode voltage level tat is different from a common mode voltage level of the differential input signals.

8. The apparatus as recited in claim 1, wherein the signal input receiver circuitry further includes:
pre-amplifier circuitry to receive the differential input signals and to produce a pre-amplified signal that corresponds to the differential input signals.

9. The apparatus as recited in claim 1, wherein the apparatus comprises at least one of an integrated circuit (IC) portion, an IC chip, and a printed circuit board (PCB).

10. The apparatus as recited in claim 1, wherein the apparatus comprises at least one integrated circuit (IC) memory chip.

11. A receiving unit comprising:
a first input node and a second input node that are capable of receiving signals terminated at a first termination level in accordance with a first differential mode and signals terminated at a second termination level in accordance with a second differential mode;
a level shifter coupled to the first input node and the second input node, the level shifter to shift voltage levels of the signals terminated at the first termination level that are present at the first input node and the second input node to produce level-shifted signals; and
a mode select input for selecting between the first differential mode and the second differential mode.

12. The receiving unit as recited in claim 11, wherein the first termination level comprises a ground termination level, and the second termination level comprises a non-ground termination level.

13. The receiving unit as recited in claim 11, wherein the mode select input controls activation of a switched voltage divider into a first termination configuration in accordance wit the first differential mode and into a second termination configuration in accordance with the second differential mode.

14. The receiving unit as recited in claim 13, wherein the switched voltage divider includes:
a first resistive element a second resistive element, and a first switch connected in series between a supply voltage and a common potential; the first resistive element directly coupled to the second resistive element at a first node; and
a second switch directly coupled to the first node.

15. The receiving unit as recited in claim 11, further comprising:
data recovery circuitry to recover data from signals that are input thereto;
wherein the data recovery circuitry is provided at least a version of the level-shifted signals for the first differential mode and at least a version of the signals terminated at the second termination level for the second differential mode responsive to the mode select input.

16. The receiving unit as recited in claim 15, further comprising:
a selectable pre-amplifier that receives as input the signals terminated at the second termination level from the first and second input nodes and the level-shifted signals from the level shifter, the selectable pre-amplifier to pro-amplify the signals terminated at the second termination level or the level-shifted signals and to forward selected and pro-amplified signals as output responsive to the mode select input; and
wherein the data recovery circuitry receives as input for data recovery the selected and pro-amplified signals from the selectable pre-amplifier.

17. The receiving unit as recited in claim 16, wherein the at least a version of the level-shifted signals for the first differential mode that is provided to the data recovery circuitry comprises the pro-amplified level-shifted signals, and wherein the at least a version of the signals terminated at the second termination level for the second differential mode that is provided to the data recovery circuitry comprises the pro-amplified signals terminated at the second termination level.

18. The receiving unit as recited in claim 15, wherein:
the level shifter comprises a level shifter and pre-amplifier to pre-amplify the level-shifted signals and to produce level-shifted and pre-amplified signals; and
the data recovery circuitry comprises selectable data recovery circuitry to select for data recovery between a first input and a second input responsive to the mode select input, wherein the first input receives the level-shifted and pre-amplified signals from the level shifter and pro-amplifier and the second input receives the signals terminated at the second termination level from the first and second input nodes.

19. The receiving unit as recited in claim 11, wherein the receiving unit comprises at least one of an integrated circuit (IC) portion, an IC chip, and a printed circuit board (PCB).

20. The receiving unit as recited in claim 11, wherein the receiving unit comprises at least one integrated circuit (IC) memory chip.

21. An apparatus comprising:
a transmitting unit to transmit a differential signal; and a receiving unit having termination mode selection circuitry, a termination mode selection signal, and first and second signal inputs to receive the differential signal;

wherein the termination mode selection circuitry selectively provides, in response to the termination mode selection signal, a ground termination or a non-ground termination to the differential signal.

22. The apparatus as recited in claim 21, wherein the termination mode selection circuitry includes at least one termination resistive element.

23. The apparatus as recited in claim 21, wherein the ground termination or the non-ground termination is set approximately equal to a line impedance.

* * * * *

UNITED STATES PATENT AND TRADEMARK OFFICE
CERTIFICATE OF CORRECTION

| | | |
|---|---|---|
| PATENT NO. | : 7,102,390 B2 | Page 1 of 1 |
| APPLICATION NO. | : 11/058088 | |
| DATED | : September 5, 2006 | |
| INVENTOR(S) | : Yohan U. Frans et al. | |

It is certified that error appears in the above-identified patent and that said Letters Patent is hereby corrected as shown below:

In the Claims:

Claim 7, Column 21, Line 36, replace "tat is" with --that is--
Claim 16, Column 22, Line 31, replace "pro-amplify the" with --pre-amplify the--
Claim 16, Column 22, Line 33, replace "pro-amplified signals" with --pre-amplified signals--
Claim 16, Column 22, Line 36, replace "pro-amplified signals" with --pre-amplified signals--
Claim 17, Column 22, Line 41, replace "comprises the pro-amplified" with --comprises the pre-amplified--
Claim 17, Column 22, Line 45, replace "pro-amplified signals" with --pre-amplified signals--
Claim 18, Column 22, Line 56, replace "and pro-amplifier and" with --and pre-amplifier and--

Signed and Sealed this

Twentieth Day of November, 2007

JON W. DUDAS
*Director of the United States Patent and Trademark Office*